US010904661B2

(12) United States Patent
Poulsen et al.

(10) Patent No.: US 10,904,661 B2
(45) Date of Patent: Jan. 26, 2021

(54) LOW DELAY DECIMATOR AND INTERPOLATOR FILTERS

(71) Applicant: SYNAPTICS INCORPORATED, San Jose, CA (US)

(72) Inventors: Jens Kristian Poulsen, Kitchener (CA); Trausti Thormundsson, Irvine, CA (US); Ali Abdollahzadeh Milani, San Francisco, CA (US); Mark Miller, Mission Viejo, CA (US)

(73) Assignee: SYNAPTICS INCORPORATED, San Jose, CA (US)

(*) Notice: Subject to any disclaimer, the term of this patent is extended or adjusted under 35 U.S.C. 154(b) by 0 days.

(21) Appl. No.: 16/177,308

(22) Filed: Oct. 31, 2018

(65) Prior Publication Data

US 2019/0132679 A1 May 2, 2019

Related U.S. Application Data

(60) Provisional application No. 62/579,809, filed on Oct. 31, 2017.

(51) Int. Cl.
*H03H 17/02* (2006.01)
*G10K 11/178* (2006.01)
(Continued)

(52) U.S. Cl.
CPC ............. *H04R 3/04* (2013.01); *G10K 11/178* (2013.01); *G10L 21/0216* (2013.01);
(Continued)

(58) Field of Classification Search
CPC .............. G10K 11/178; G10L 21/0216; G10L 2021/02163; H04R 3/04; H04R 1/1083;
(Continued)

(56) References Cited

U.S. PATENT DOCUMENTS 6,442,581 B1 * 8/2002 Laroche ............ H03H 17/0285 708/318
8,526,628 B1 * 9/2013 Massie ................ G10K 11/178 381/71.1
(Continued)

OTHER PUBLICATIONS

Johansson et al., "Design of Bireciprocal Linear Phase Lattice Wave Digital Filters", Department of Electrical Engineering, Linköping University, S-581 83, Jan. 31, 1996, pp. 1-17, Linköping, Sweden.
(Continued)

*Primary Examiner* — Vivian C Chin
*Assistant Examiner* — Ubachukwu A Odunukwe
(74) *Attorney, Agent, or Firm* — Haynes and Boone, LLP

(57) ABSTRACT

Systems and methods for low latency adaptive noise cancellation include an audio sensor to sense environmental noise and generate a noise signal, an audio processing path to receive an audio signal, process the audio signal through an interpolation filter, and generate a primary audio signal having a first sample frequency, an adaptive noise cancellation processor to receive the noise signal and generate an anti-noise signal, a direct interpolator to receive the anti-noise signal and generate an anti-noise signal having the first sample frequency, and a limiter to provide clipping to reduce a number of bits in the anti-noise signal, an adder operable to combine the primary audio signal and the anti-noise signal and generate a combined output signal, and a low latency filter to process the combined output signal.

20 Claims, 22 Drawing Sheets

(51) Int. Cl.

| | |
|---|---|
| ***H04R 3/04*** | (2006.01) |
| ***G10L 21/0216*** | (2013.01) |
| ***H04R 1/10*** | (2006.01) |
| *H04R 3/00* | (2006.01) |

(52) U.S. Cl.
CPC .. *H04R 1/1083* (2013.01); *G10L 2021/02163* (2013.01); *H04R 3/00* (2013.01); *H04R 2460/01* (2013.01)

(58) Field of Classification Search
CPC .................. H04R 3/00; H04R 2460/01; H03H 2017/0214
USPC .................. 381/71.1, 71.6, 71.8, 71.11, 94.8
See application file for complete search history.

(56) References Cited

U.S. PATENT DOCUMENTS 8,611,551 B1 12/2013 Massie et al.
2008/0212791 A1* 9/2008 Asada .................. G10K 11/178 381/71.6
2010/0195844 A1* 8/2010 Christoph ........ G10K 11/17817 381/71.11
2010/0310086 A1 12/2010 Magrath et al.
2011/0007907 A1* 1/2011 Park ..................... G10K 11/178 381/71.8
2011/0116654 A1* 5/2011 Chan .................... G10K 11/178 381/94.8
2012/0308025 A1 12/2012 Hendrix et al.
2015/0010170 A1* 1/2015 Lindahl .............. H03H 17/0261 381/119
2016/0240183 A1* 8/2016 Noh ....................... H03G 5/005

OTHER PUBLICATIONS

John Knight, "Laboratory 2.0, A 3-Bit Binary Sign-Extended Adder/ Subtracter", Department of Electronics, ELEC 2607, Switching Circuits, Jan. 30, 2008, pp. Lab2-1-Lab2-12, Carleton University, Ottawa, Ontario, Canada.

* cited by examiner

Overall frequency response 0-1536 kHz

Overall frequency response 0-384kHz

Overall frequency response 0-20kHz

Overall group delay 0-1536 kHz

Overall group delay 0-20 kHz

2000

2050

LOW DELAY DECIMATOR AND INTERPOLATOR FILTERS

CROSS-REFERENCE TO RELATED APPLICATIONS

The present application claims the benefit of and priority to U.S. Provisional Patent Application No. 62/579,809, filed Oct. 31, 2017, which is hereby incorporated by reference in its entirety.

TECHNICAL FIELD

The present application relates generally to systems and methods for digital signal processing, and more particularly to sample rate conversion, for example, in adaptive noise cancellation systems.

BACKGROUND

The conversion of digital signals to different sample rates suitable for various digital components and processes is well known. For example, it is common for a digital signal processing system to use different sampling rates depending on a desired signal quality, required bandwidth, latency requirements, processing economy, available silicon area and other considerations. In audio processing systems, different sample rates may be used to achieve low latency and high performance. For example, in a digital adaptive noise cancellation (ANC) system, audio processing and ANC processing may be performed at different sample rates allowing for increased bandwidth of the ANC system (see, e.g., "Understanding Active Noise Cancellation", Colin H. Hansen, ISBN 0415231922).

There are, however, issues in combining signals with uniform delay in systems using oversampled converter structures. One solution is to perform the processing in the analog domain, thereby circumventing the delay problems associated with digital oversampled processing. However, this will typically have limited ability to adapt over a wide frequency range, and other solutions suffer from a limited frequency resolution and limited attenuation of the undesired noise. Furthermore, these solutions are often sensitive to changes in components and implementation dependent. In view of the foregoing, there is a continued need for improved systems and methods for adaptive noise cancellation processing using oversampled converter structures.

SUMMARY

Systems and methods are disclosed herein for providing low latency adaptive noise cancellation (ANC). In various embodiments, a system includes an audio sensor operable to sense environmental noise and generate a noise signal, an audio processing path operable to receive an audio signal, process the audio signal through an interpolation filter, and generate a primary audio signal having a first sample frequency, an adaptive noise cancellation processor operable to receive the noise signal and generate a corresponding an anti-noise signal, a direct interpolator operable to receive the anti-noise signal and generate an upsampled anti-noise signal having the first sample frequency, the direct interpolator comprising a sign extension stage operable to extend most significant bits of the anti-noise signal to avoid overflow, and a limiter operable to provide clipping to reduce a number of bits in the upsampled anti-noise signal, an adder operable to receive and combine the primary audio signal and the upsampled anti-noise signal and generate a combined output signal, and a low latency filter operable to process the combined output signal.

In some embodiments the low latency filter includes a plurality of filters, each performing filtering at a different sample frequency. The low latency filter may include a plurality of lattice wave filters disposed in a cascaded arrangement, wherein each of the plurality of lattice wave filters processes a different frequency band. In some embodiments, the sample frequency is increased in integer steps in each successive filter. The lattice wave filters may include a plurality of delay elements, and direct sampling at a particular output sample frequency may be achieved by interlacing multiple filters. In one implementation, N delay elements are provided in reflector sections (two-port adaptors) and one path is delayed by N/2 delay elements, and another path is directly connected to an input signal, for N equals a sequence of positive integer exponents of two. In another implementation, the lattice wave filter comprises two paths, including one path including a plurality of reflector elements with each reflector element delayed by N unit delays, where N is an integer greater than one, and one path delayed by M delay elements, where M is an integer greater than one. In some embodiments, the adaptive noise cancellation processor is further operable to derive the anti-noise signal by the adaptive cancellation processor, where the filter coefficients are calculated by a filtered-X least mean squares process, either operating in the time- or frequency domain.

In various embodiments, a system includes an audio processing path operable to receive and process a primary audio signal having a first sample frequency, an adaptive noise cancellation path comprising a decimator operable to downsample the primary audio signal to a second sampling frequency, an adaptive noise cancellation processor operable to receive the primary audio signal and a noise signal at the second sample frequency and generate an anti-noise signal having the second sample frequency, and an interpolator operable to upsample the anti-noise signal to the first sample frequency, and an adder operable to combine the anti-noise signal and the primary audio signal at the first sample frequency. The decimator and interpolator each comprise a plurality of filters operable to perform filtering at corresponding plurality of sample frequencies.

In some embodiments, each of the adaptive noise cancellation path and the audio processing path includes oversampled lattice filters comprising a plurality of delay elements arranged to enable uniform delay. The system may further comprise a microphone operable to sense environmental noise and generate corresponding electrical signals, and a low delay decimator to generate the noise signal at the second sample frequency. The system may further comprise an oversampled interpolation filter that has input and output sample frequencies that match the first sample frequency, and is operable to remove aliased images generated by the interpolator in the adaptive noise cancellation path. In some embodiments, each of the plurality of filters comprises a multi-stage lattice wave filter structure where each stage changes an operating sample rate by a factor of two. The decimator and interpolator may each comprise a sign extension stage operable to extend the most significant bits of a received signal to avoid overflow, and a limiter operable to provide clipping to reduce a number of output bits.

In various embodiments, a method comprises sensing environmental noise and generating a noise signal, processing an audio signal through an interpolation filter to generate a primary audio signal having a first sample frequency, generating, from the noise signal, an anti-noise signal having a second sample frequency, directly interpolating the anti-noise signal to generate an upsampled anti-noise signal having the first sample frequency, wherein directly interpolating include extending most significant bits of the anti-noise signal to avoid overflow and multiplying the ANC reference by a gain factor equal to the interpolation factor, and clipping to reduce a number of output bits in the upsampled anti-noise signal, combining the primary audio signal and the upsampled anti-noise signal to produce a combined output signal; and processing the combined output signal through a low latency filter.

In some embodiments, the method further includes applying a plurality of lattice wave filters disposed in a cascaded arrangement, wherein each of the plurality of lattice wave filters processes a different sample frequency that is successively changed in each successive filter. Applying the plurality of lattice wave filters may include applying a plurality of delay elements. Direct sampling at a particular output sample frequency may be achieved by interlacing multiple filters. In various embodiments, decimating the primary audio signal to downsample the primary audio signal to the second sample frequency, and generating, from the noise signal, the anti-noise signal having the second sample frequency may further include analyzing the downsampled primary audio signal. In some embodiments, the method includes generating, from the noise signal, the anti-noise signal having the second sample frequency comprises calculating filter coefficient using a filtered-X least mean squares process.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, wherein showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

Figure 1:
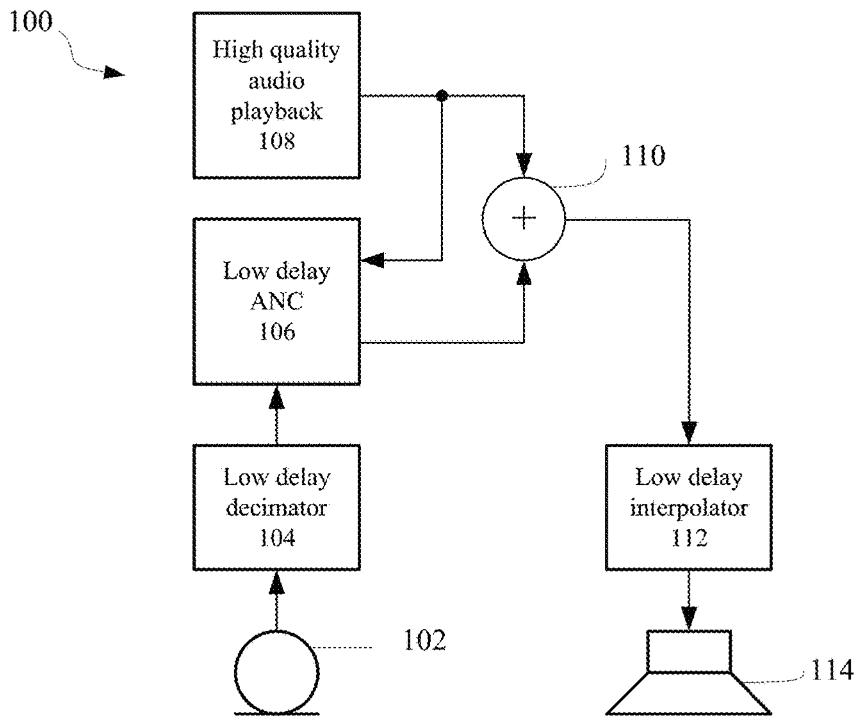
FIG. 1 is a first example of an adaptive noise cancellation system, in accordance with one or more embodiments.

In accordance with various embodiments of the present disclosure, systems and methods for achieving low latency and high-quality audio output in adaptive noise cancellation filters are disclosed.

Noise cancellation and noise reduction techniques are used in a variety of applications to improve user experiences in noisy environments. In one approach a listening device, such as headphones, headsets or ear buds, includes one or more audio sensors to pick up environmental noise and adaptive noise cancellation processing circuitry to generate an anti-noise signal to cancel or reduce the environmental noise for the user. It is desirable for the generated anti-noise signal to be equal to the inverse of the noise disturbance (thereby cancelling the noise) while desired audio, such as the playback from a high-fidelity audio source, is provided with minimal disturbance. To obtain desired attenuation of the environmental noise, ANC systems are designed for low latency processing of the received noise signals to generate an inverted output signal that has a minimal phase shift with respect to the original noise signal to obtain a wide bandwidth of noise cancellation. In many listening environments, a feedback signal having a latency of around 10 μs can be used to obtain a noise reduction bandwidth of around 20 kHz, with the actual obtained bandwidth depending on the topology of the noise cancellation system and the actual acoustics system.

Various embodiments of the present disclosure are directed to noise cancellation systems that use oversampled converters in high-quality audio playback systems. In one embodiment, delta-sigma analog-to-digital converters (ADCs) and digital-to-analog converters (DACs) are used for audio signal processing. As compared to Nyquist sample rate converters, delta-sigma converters utilize a higher sample rate and are generally cheaper to implement because they require less precision in the analog signal components. Therefore, both from a cost and processing perspective, it is often advantageous to perform the noise cancellation at a higher sample rate than required by the Nyquist criterion and this can be used to obtain a wider noise cancellation bandwidth.

One complication with multi-rate signal processing is the possibility of increased latency. In ANC systems, it is desirable to provide a time-accurate reference for the active noise processing system, both of the measured noise (undesired signal) and high fidelity audio (desired signal), in order to generate an anti-noise signal that is in phase with the environmental noise to be cancelled. In some embodiments, lattice wave filters, which are known for low sensitivity to coefficient changes, are used to obtain simplified filter solutions that do not require multiplication. To obtain low latency, a low filter order is desired, but this may have the unfortunate property that the attenuation for out-of-band signals is lower which can be a problem for high-quality audio signals where good out-of-band attenuation is desired.

A system 100 for performing adaptive noise cancellation (ANC) in accordance with embodiments of the present disclosure will now be described with reference to FIG. 1. The system 100 may be implemented in noise cancelling headphones, ear buds or other systems that sense noise from an environment and generate a noise cancelling signal. The system 100 includes at least one microphone 102 or other audio sensor to sense the environmental noise from one or more noise sources and generate corresponding electrical signals representing the sensed noise. In various embodiments, the at least one microphone 102 may be arranged in a feed-forward, feedback, or combined feed forward/feedback ANC system. The output of the microphone 102 may be a digital oversampled bit stream, e.g. the output from a single-bit digital microphone, or an analog signal that is provided to a pre-amplifier and a delta-sigma converter (single-bit or multi-bit) to produce the digital oversampled audio signal. The digital audio signal is decimated to a lower sample rate by a low delay decimator 104, such as a multi stage lattice wave filter, for input to a low delay ANC processor 106.

The low delay ANC processor 106 generates an anti-noise signal corresponding to the environmental noise sensed by the microphone 102. The ANC processor 106 also receives a time-accurate, audio playback signal from the high-quality audio playback processor 108, which is used as an audio reference signal. In various embodiments, the ANC processor 106 uses a time or frequency update of internal filter nodes to adaptively filter the environmental noise from the microphone signal, which may also include desired audio played through a speaker 114. For example, the ANC processor 106 may implement a filtered-x least mean squares (FXLMS) algorithm to adaptively modify filter coefficients to filter out the environmental noise. To obtain a low latency, finite impulse response (FIR) topologies are often used while the filter updates are often performed in the frequency domain to obtain fast adaption even when there is a significant spread among the power spectrum of the noise. This enables fast adaptation even at frequencies where the energy content is significantly smaller than any dominant nodes by separating the signals in the frequency domain. An inverse frequency transform may be used to transform the adapted weights back to the time domain.

The audio playback processor 108 generates the desired audio signal (also referred to herein as the primary audio signal) for playback through an audio output, such as speaker 114. The desired audio signal may be generated from a source file (e.g., recorded music or movie file) or output from another source, such as a near end microphone or an audio signal received from a far end microphone in a voice over IP system. The desired audio signal is combined with the anti-noise signal output by the ANC processor 106 by the adder 110. The summed output of these signals is filtered and upconverted using a low latency interpolator 112 and output to the speaker 114 (sometimes called a receiver).

It will be appreciated that, for simplicity, some standard components are not shown in FIG. 1, for example, a microphone preamplifier, a possible microphone high voltage pump used in MEMS microphones, low noise power supply unit, speaker amplifier, a power source and other components of the system 100. These components are known to those skilled in the art and will be included in various practical system implementations, but have been omitted here for clarity in the showing the processing path.

Figure 2:
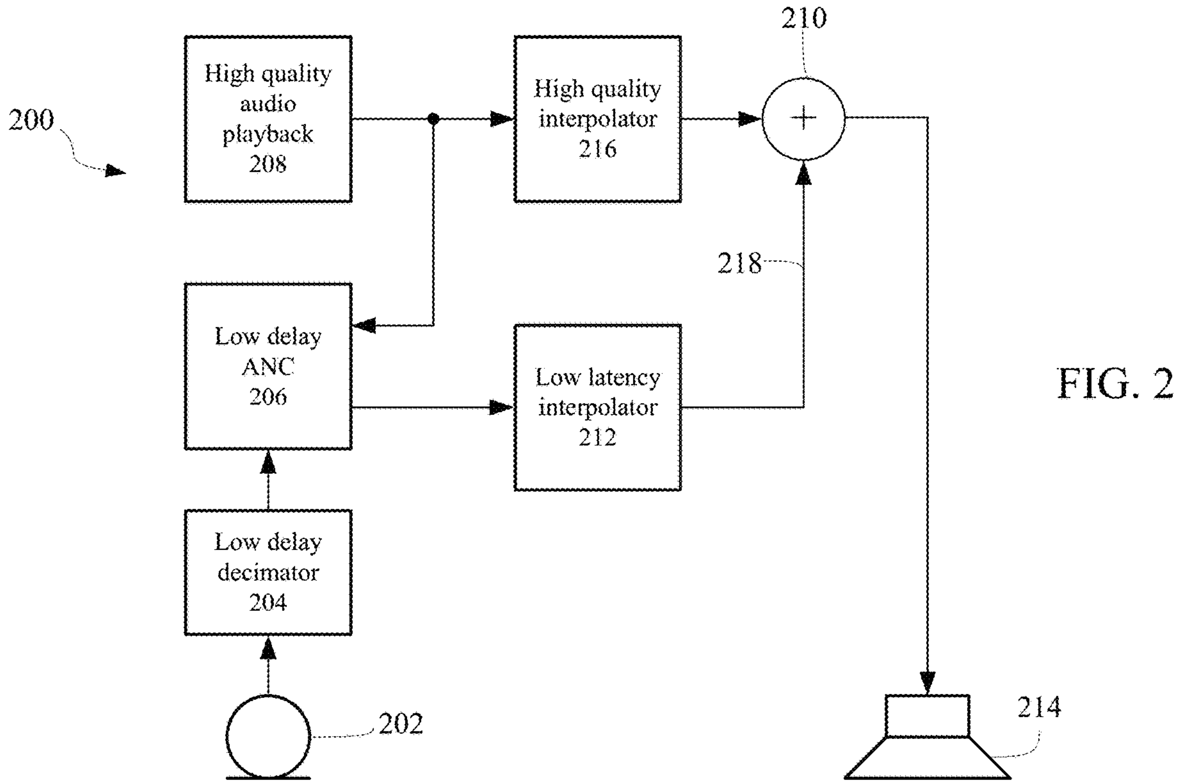
FIG. 2 is a second example of an adaptive noise cancellation system, in accordance with one or more embodiments.

In various embodiments of the system 100, both the high-fidelity audio signal and the ANC output signals are represented at the same low sample rate (e.g. 192 kHz) and are therefore both subjected to the same low-fidelity interpolation filter—provided a low latency in the processing path is a design goal. While it is possible to increase the processing sample rate, this will increase power consumption and physical size of the design considerably. Therefore, it is desired to simultaneously be able to combine a high-quality interpolation filter for audio playback and a low latency filter path for the ANC processing (also referred to herein as the adaptive noise cancellation path). This may be implemented as shown in the embodiment of FIG. 2, which illustrates components of a system 200 for performing adaptive noise cancellation (ANC).

The system 200 includes a microphone 202, low delay decimator 204 and low delay ANC processor 206 for receiving a noise signal and generating an anti-noise signal. The anti-noise signal is provided to a low latency interpolator 212 to produce the anti-noise signal 218 to be combined with the high-quality audio signal (also referred to herein as the primary audio signal) by adder 210. High-quality audio is provided by high-quality audio playback 208 to the ANC processor 206 for use as the ANC reference signal. As illustrated, the high-quality audio signal and the noise signal are at the same low sample rate (e.g., 192 kHz), suitable for efficient ANC processing. A high-quality interpolator 216 ("high-quality" meaning including sufficient dynamic range, attenuation etc. for the system requirements) increases the sampling rate of the high-quality audio signal for output to the speaker 214 and adds latency to the high-quality audio signal processing path. Because the ANC processor 206 uses a time-accurate audio reference of the audio output, the different signal processing paths of the two signals (output from block 208 and 206) experience a different signal processing path (i.e. through filters 212 and 216 respectively), which creates differences in the internal group delays, leading to less than optimal adaption in the ANC processing unit. The different latencies between blocks 212 and 216 will cause the signals to be out of phase which decreases performance of the noise cancellation. Therefore, the issues with the system of FIG. 1 cannot be solved by simply adding the output from a high-fidelity quality interpolator 216 and a low latency interpolation filter 212. Thus, neither system 100 nor system 200 solves the problem of time accurate references for the ANC system while providing both a low delay path for the ANC signal and a high-fidelity signal path for the reference audio signal.

Figure 3:
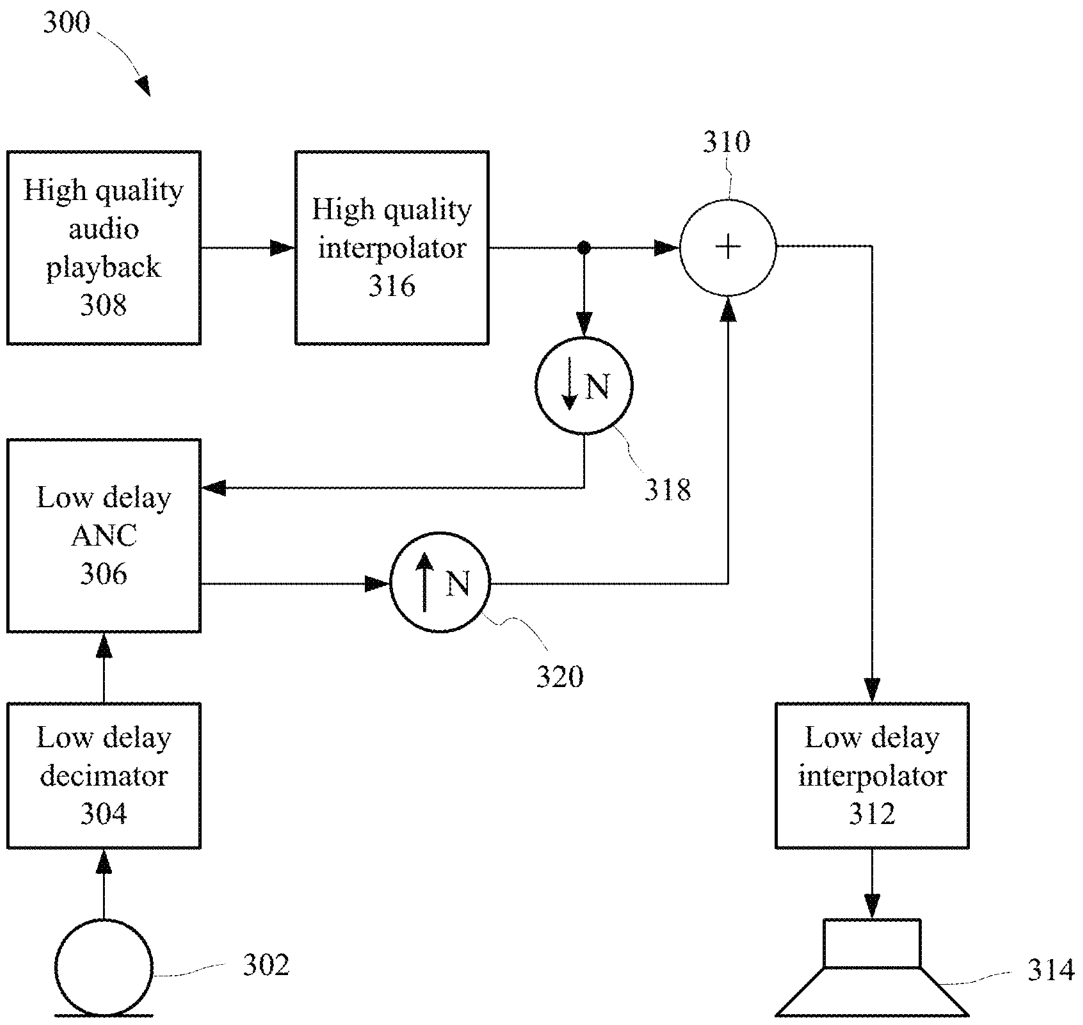
FIG. 3 is a third example of an adaptive noise cancellation system, in accordance with one or more embodiments.

An embodiment of a system 300 providing time accurate references for the ANC system while providing both a low delay path for the ANC signal and a high-fidelity signal path for the reference audio signal is illustrated in FIG. 3. The microphone 302, low delay decimator 304, low delay ANC processor 306, high-quality audio playback processor 308, high-quality interpolator 316 and speaker 314 may be implemented as illustrated in FIGS. 1 and 2, previously discussed. The high-quality audio playback processor 308 generates a high-quality audio signal which is fed to the high-quality interpolator 316 (i.e., a high-fidelity interpolation filter). To avoid problems with high power consumption, excessive complexity or differences in delays, this high-fidelity oversampled output of the high-quality interpolation filter is decimated by a factor of N by decimator 318 which operates without filtering (i.e., selects every Nth sample). Filtering (e.g., anti-aliasing) is not required because out-of-band signals are removed by the high-quality interpolator 316 and the signal bandwidth is therefore unchanged. The ANC processor 306 output signal (anti-noise signal) is directly upsampled to a higher frequency in interpolator 320 by a factor of N to match the frequency of the high-quality audio signal. In one embodiment, the output signal is upsampled to a higher frequency by inserting N−1 samples equal to zero between each original sample. This operation will introduce multiple mirror aliases of the original noise signal. The anti-noise signal is combined with the high-fidelity oversampled output by adder 310, and the combined output signal is sent to the low delay interpolator 312.

The low delay interpolator 312 in this embodiment is an oversampled interpolator that operates at the higher sample rate of the initial audio output times N, and removes the aliased images that will be output from the directly interpolated signal from the ANC processor 306, while the original oversampled high-fidelity oversampled audio signal will pass through unchanged since the aliased images have already been removed by the high-quality interpolator. The oversampled interpolator 312 may be implemented by adding extra delay elements inside each filter section, i.e. each filter section includes N, N/2. N/4 etc. times the original delay elements to obtain the same frequency response as the original filter configuration operating at N, N/2, N/4 times lower sample frequency. Furthermore, this filter configuration solves practical implementation problems, because the filter elements are updated at the much higher sample rate of N times the original sample rate, thereby enabling an optimal group delay of the filters. In this case, the theoretical performance may be obtained without introducing extra delays due to a practical register transfer level implementation that often can give delays when transferring values between systems with different sample rates (i.e., difference sample frequencies). Other filter configurations than Lattice Wave filter may be used in the general solution shown in FIG. 3 and any solution should not be limited to these.

In various embodiments, the oversampled interpolation filter has same input and output sample frequency, and can also be used as a low latency decimation filter and thereby lower latency further by reducing the input path delay. It is essentially a low pass filter with very low delay and wide bandwidth, and it is possible to add a second decimation path for high-fidelity applications.

For various implementations, the filter may be optimized by first designing a filter with a response that may be ideal from an out-of-band attenuation point of view, and then further optimize the filter by adjusting the coefficients to improve the actual signal-to-noise-ratio (SNR) at the output of the filter, thereby taking the actual noise shaping of the used delta-sigma converters into account. Further, the coefficients may be discretized to remove multiplications in the actual implementation thus lowering silicon area, cost and power consumption significantly.

Embodiments of an oversampled filter implementation 400 will now be described with reference to FIG. 4. As previously discussed, to obtain low latency, low power, low silicon area and high performance in a digital ANC feedback loop, it may be an advantage to perform audio and ANC processing at different sample rates. In the illustrated embodiment the audio signal is sampled at a 3.072 MHz rate, and the ANC processing at a lower 192 kHz rate, though it will be appreciated that other sampling rates may be used in accordance with system requirements. The audio processing itself may be performed at the same rate as the ANC (192 kHz) or at a lower rate, e.g. 48 kHz. There are however, problems in combining these signals with uniform delay when using oversampled converter structures. While the decimation path can be performed separately, there may be problems in combining the ANC processing and audio path together with uniform delay. If the interpolation path has been optimized for low latency, there will not be much attenuation of out-of-band mirror images from the audio path and similarly, if there is made a compromise on the latency to improve the audio path, bandwidth and ANC performance suffers.

Figure 4:
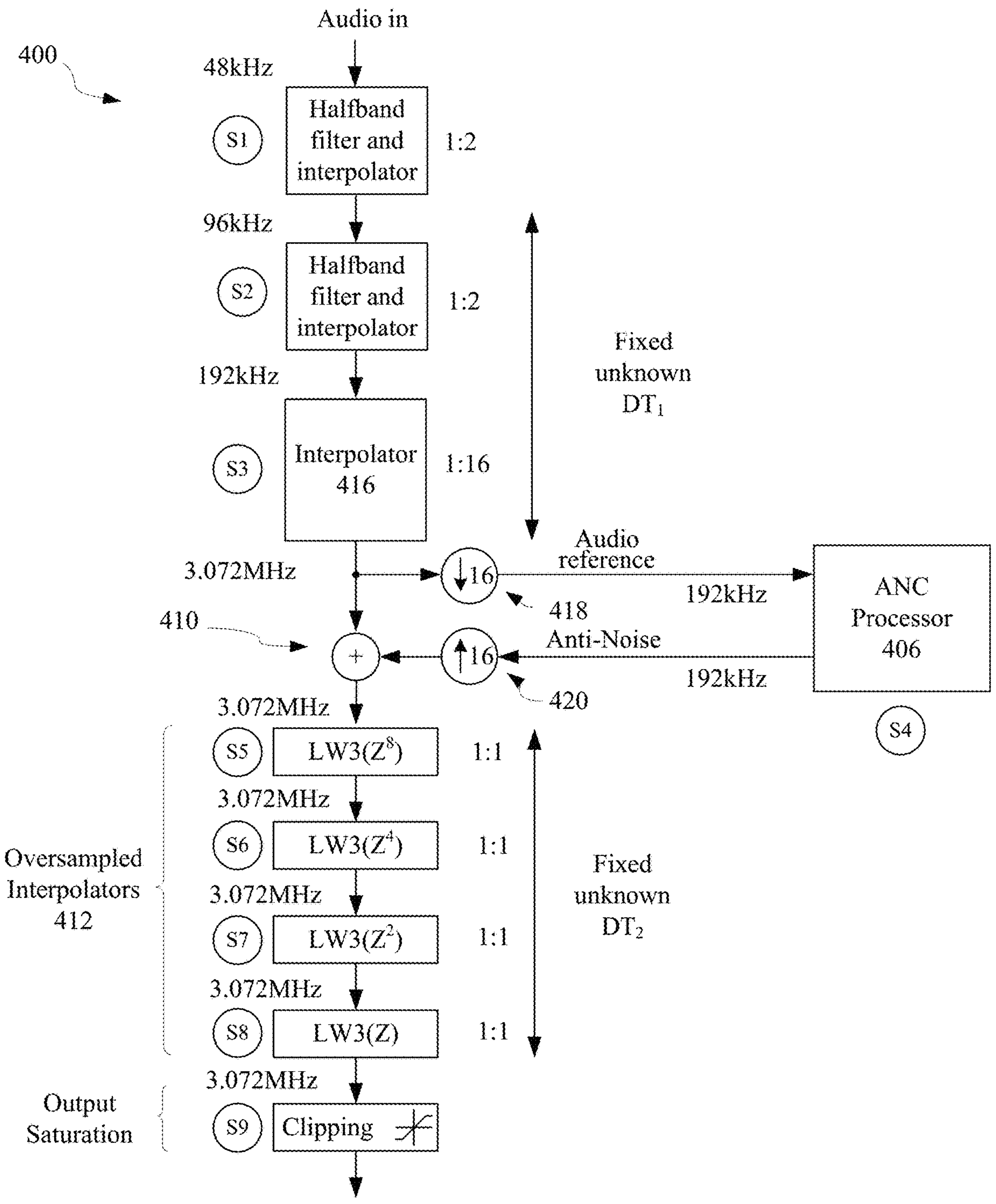
FIG. 4 is an example of an adaptive noise cancellation system similar to FIG. 3 using an oversampled interpolation filter, in accordance with one or more embodiments.

To obtain both high audio quality and low uniform path delay of the audio signal and the ANC anti-noise signal, the embodiment of FIG. 4 includes oversampled interpolators in a topology that enables uniform delay of both paths. As illustrated, the high-quality audio input signal is sampled at 48 kHz, and upsampled by halfband filters (sections S1 and S2) to 192 kHz. The interpolation filter 416 is a high-quality interpolator that removes aliased mirror images and upsamples the signal by a factor of 16 to the output audio sample rate of 3.072 MHz. The audio signal is filtered in the audio processing path and the combination of the audio signal and the anti-noise signal is performed at the oversampled output frequency (3.072 MHz). In this embodiment, a short ANC delay and sufficient audio mirror attenuation is achieved simultaneously. In various embodiments, the audio path is filtered after the original path (i.e., after the combination with the anti-noise signal), and this may result in a slight attenuation of the highest frequencies and further reduction of out-of-band noise. Undesired in-band attenuation of the audio signal by the ANC oversampled interpolator can be corrected by a small equalization done before the upsampling of the signal occurs. In various embodiments low delay lattice wave filters are used for the oversampled interpolation filter to minimize latency in the loop. The oversampled interpolation filter may be used with slight modification for decimation in the noise signal path for the ANC to ensure low latency in this path too, i.e., the digital signal from the microphone to decimated output is processed using an oversampled decimator with similar structure as the oversampled interpolator.

In the illustrated embodiment, ANC processing is performed at a 192 kHz sample rate. The audio signal is decimated by a factor of N=16 by decimator 418 (i.e., pull out every 16*th* sample) to generate the 192 kHz reference signal for ANC processing. The ANC processor 406 outputs a 192 kHz anti-noise signal, which is upsampled by a factor of N=16 by interpolator 420 to produce a 3.072 MHz anti-noise signal which is combined with the audio signal by adder 410. In a practical implementation, there may be included a multiplier after interpolator 420 to ensure the low frequency energy levels from section S3 and block 420 are matching. This multiplier is not shown in FIG. 4. The multiplier would typically consist of a simple shifting of the bits (e.g. shift 4 times for a multiply by 16). Thus, the interpolator 420 would not merely consist of inserting zeros between samples, but furthermore multiply every output sample by the same factor as the interpolation rate. In one embodiment, the interpolated anti-noise signal includes multiple aliased images because the signal was interpolated without filtering. Next, oversampled interpolation filters 412 (sections S5, S6, S7, S8) remove the out-of-band images from the combined signal, while allowing the audio signal to pass through unfiltered in the passband. Each of the oversampled interpolation filters 412 has a different number of internal delays (e.g., 8, 4, 2, 1) which causes the filters to run at different speeds to remove the out-of-band images, step by step. This way, the ANC signal and the audio signal will have the same group delay at all frequencies and thereby enable high-quality noise suppression.

It will be appreciated by those skilled in the art that the embodiments disclosed herein provide numerous advantages over conventional systems. The embodiments enable low and well controlled latency, independent filtering of the ANC and audio path and enable the same delay of both paths after the summation point.

In one embodiment, a word length of 24 fraction bits is used to connect directly to conventional audio components, and an internal representation of 25 bits is used that include one overflow bit. In theory, up to two overflow bits may be necessary to avoid overflow under all conditions, but in a practical implementation, one overflow bit may be enough. The audio components may be connected directly to the filter. The ANC processor may be directly connected to the filter. In one embodiment, the least significant bit (LSB) of node X3 (the node X3 is shown in subsequent figures) is set to zero in all the oversampled filters to avoid limit cycles. Tests have shown no significant deterioration in the SNR if only 22 bits are used (instead of 25 bits) given the already limited dynamic range of the chosen delta-sigma converters. It will be appreciated that, although the filter S5 to S8 has been illustrated in the sequence {S5, S6, S7, S8} in FIG. 4, other sequences of these filters may also be used due to the oversampled natures of these filters.

Figure 5:
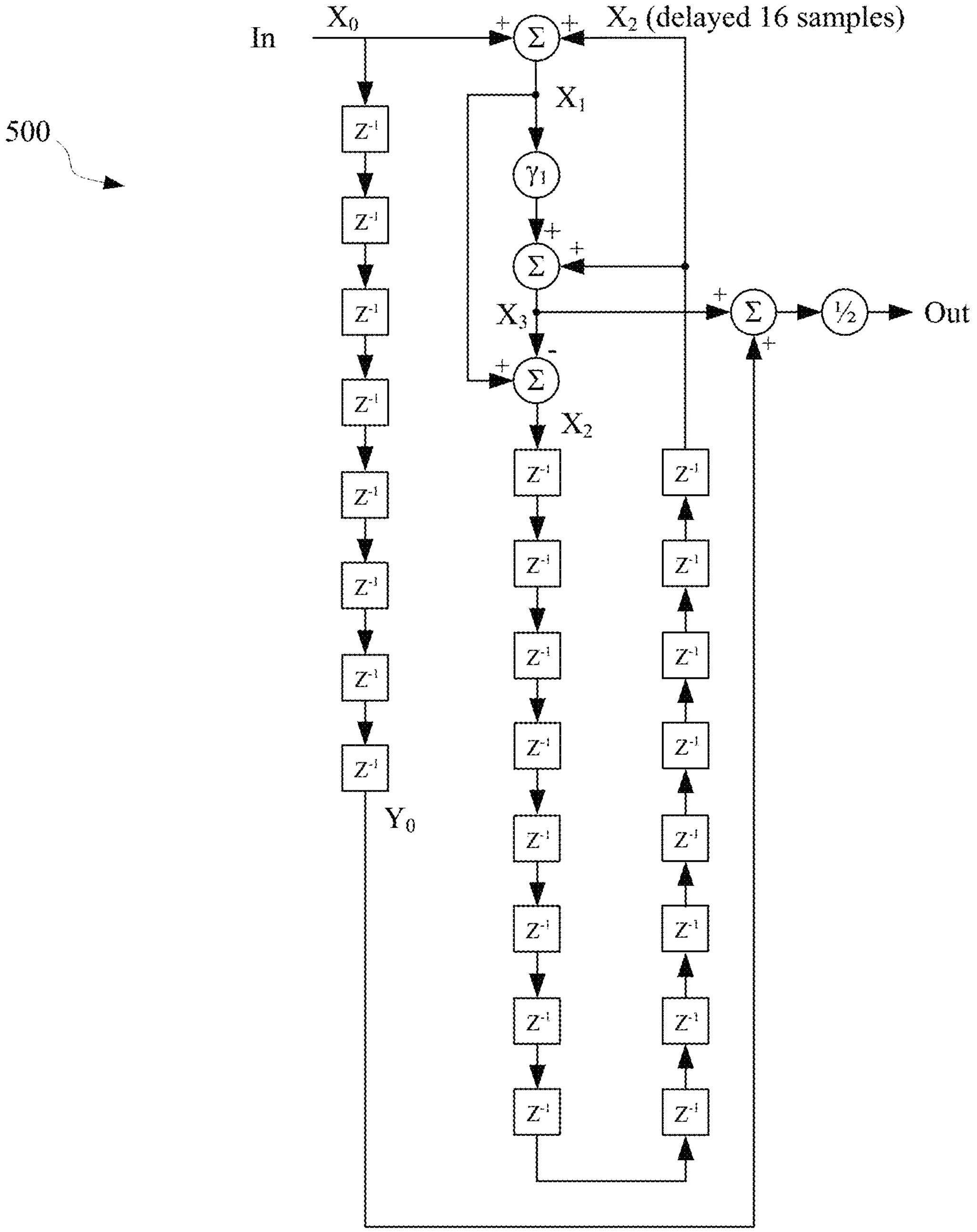
FIG. 5 illustrates a topology of an eight times oversampled interpolation or decimation filter, in accordance with one or more embodiments.

Referring to FIG. 5, an embodiment of a topology of an oversampled interpolation filter will now be described. In this embodiment, a lattice wave interpolation filter 500, such as interpolation filter at section S5 of FIG. 4, receives the 16 times oversampled audio signal and anti-noise signal. The oversampled interpolation filter has same input and output sample frequency. By operating the interpolator at a higher sample rate, it is possible to remove the aliased images that will be generated by the directly interpolated signal from the ANC processor, while the original oversampled high-fidelity oversampled audio signal will pass through virtually unchanged since the aliased images have already been removed. The oversampled interpolator operates at the higher sample rate of the initial audio output times N, and is implemented by adding extra delay elements inside each filter section, i.e. each filter section includes N (illustrated in FIG. 5), N/2, N/4 etc. times the original delay elements to obtain the same frequency response as the original filter configuration operating at N, N/2, N/4 times lower sample frequency, respectively. Furthermore, this filter configuration solves practical implementation problems, because the filter elements are updated at the much higher sample rate of N times the original sample rate, thereby enabling an optimal group delay of the filters (i.e. the theoretical performance may be obtained). One can also view this solution as a generalization of traditional lattice wave filters that have an internal delay of one or two time units in each reflector section, with the general solution being any integer used for the delays.

The transfer function for this filter can be derived with reference to the node equations as follows:

$$Y_0=X_0z^{-N}$$

$$X_1=X_0+X_2z^{-2N}=X_0+(X_1-X_3)z^{-2N}=X_0+X_1z^{-2N}-X_3z^{-2N}$$

$$X_1=(X_0-X_3z^{-2N})/(1-z^{-2N})$$

$$X_3=X_2z^{-2N}+\gamma X_1=(X_1-X_3)z^{-2N}+\gamma X_1$$

$$X_3(1+z^{-2N})=(z^{-2N}+\gamma)X_1=(z^{-2N}+\gamma)(X_0-X_3z^{-2N})/(1-z^{-2N})$$

$$X_3(1+z^{-2N})(1-z^{-2N})+X_3(z^{-2N}+\gamma)z^{-2N}=(z^{-N}+\gamma)X_0$$

$$X_3=(z^{-2N}+\gamma)X_0/(1+\gamma z^{-2N})$$

$$\text{Out}=Y_0+X_3=X_0z^{-N}+X_3=X_0(\gamma+z^{-N}+z^{-2N}+\gamma z^{-3N})/(1+\gamma z^{-2N})$$

For the filter illustrated in FIG. 5 with N=8, $$\text{Out}=Y_0+X_3=X_0z^{-8}+X_3=X_0(\gamma+z^{-8}+z^{-16}+\gamma z^{-24})/(1+\gamma z^{-16}).$$

Figure 6A:
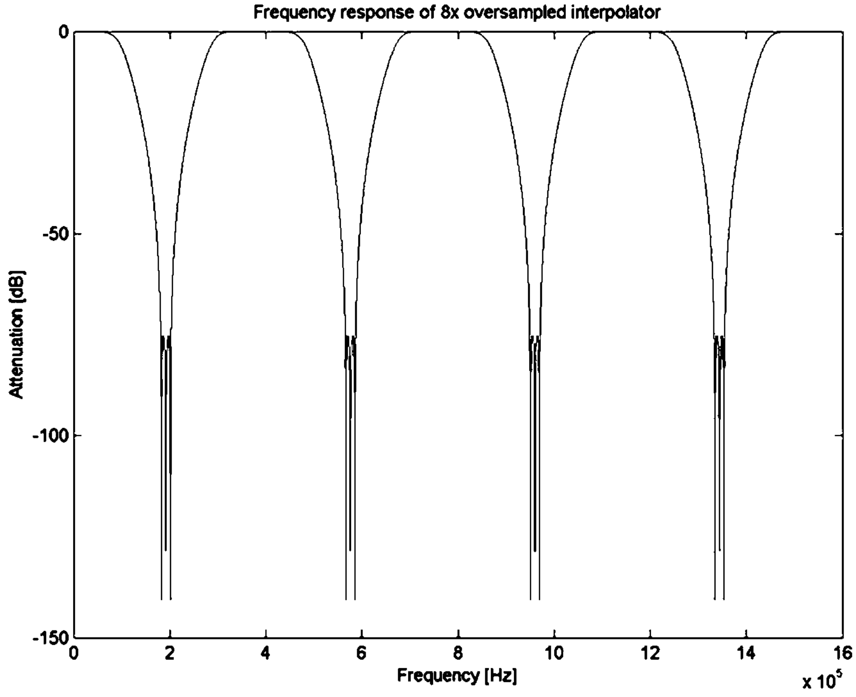
FIGS. 6A and 6B illustrate the frequency response and group delay of the oversampled filter of FIG. 5, assuming a sample frequency of 3072 kHz.
Figure 6B:
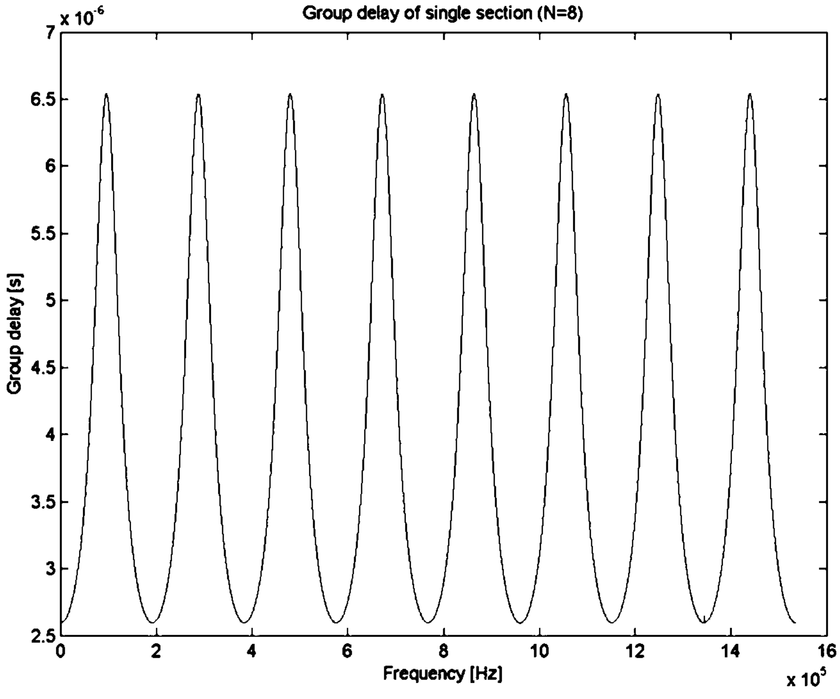

The value of γ will determine the filter cutoff frequency. The value of γ was first found from maximizing the attenuation in the stopband and minimizing the attenuation in the passband. However, a slightly better value can be found by optimizing the SNR of the output from a given delta-sigma converter structure, because this will also take into account the actual noise-shaping of this converter. After performing this optimization, a value of γ equal to 0.346656 was obtained. Due to the low sensitivity of lattice wave filters, this value may be approximated with a few add/shift operations using the following value: $\gamma=1/4+1/16+1/64+1/128$. This approximation resulted in a decrease in the SNR of less than 0.1 dB using fixed point arithmetic as compared to using floating point multiplication and the optimal value of γ. In this manner, a full multiplication operation can be replaced with 3 additions while the shifts may be hardwired, thereby saving significant silicon real estate and power. In this implementation a nonlinearity is deliberately introduced by setting the least significant bit (LSB) output from node $X_3$ to zero to avoid limit cycle problems resulting in spurious small amplitude oscillations in the filter. The frequency response and group delay of the eight times oversampled interpolator of FIG. 5 are illustrated in FIGS. 6A and 6B, respectively.

Figure 7:
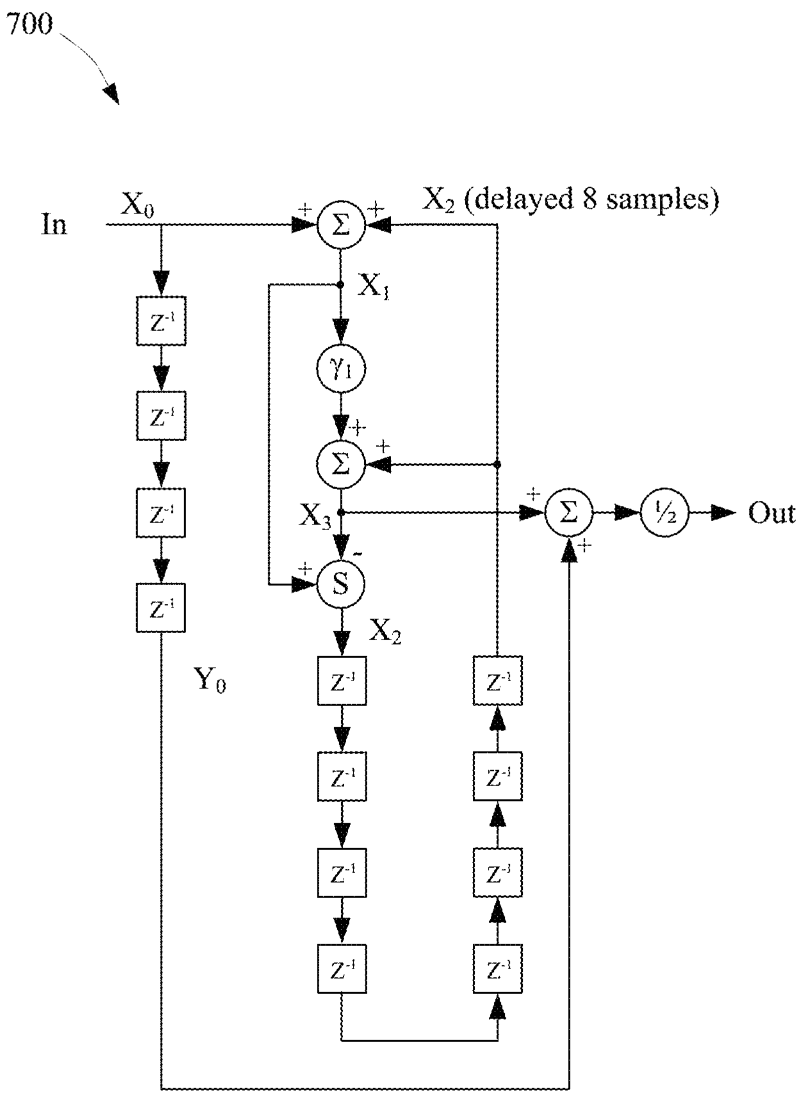
FIG. 7 illustrates a topology of a four times oversampled interpolation or decimation filter, in accordance with one or more embodiments.

Referring to FIG. 7 an embodiment of an oversampled interpolator topology 700 suitable for use in section S6 of FIG. 4 is illustrated. As illustrated, the lattice wave interpolation filter is oversampled four times and the transfer function is calculated as (N=4):

$$Out=Y_0+X_3=X_0z^{-4}+X_3=X_0(\gamma+z^{-4}+z^{-8}+\gamma z^{-12})/(1+\gamma z^{-8}).$$

Figure 8A:
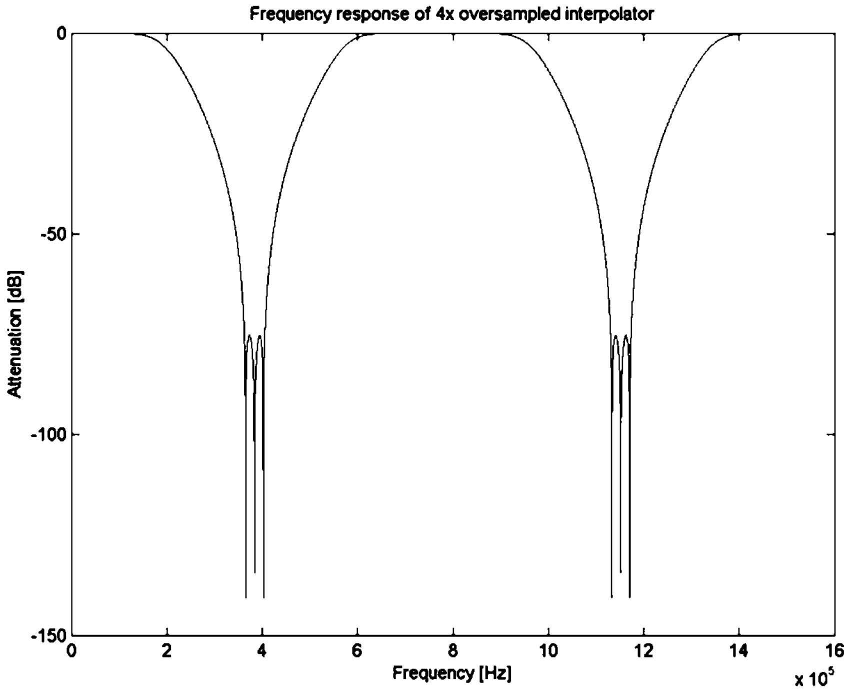
FIGS. 8A and 8B illustrate the frequency response and group delay of the oversampled filter of FIG. 7, in accordance with one or more embodiments, assuming a sample frequency of 3072 kHz.
Figure 8B:
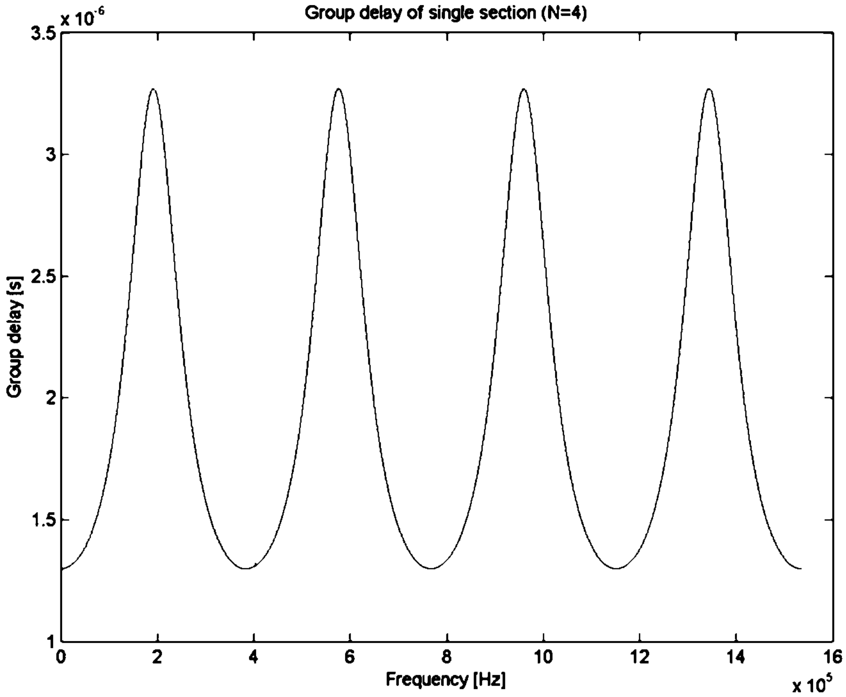

This filter behaves like a filter with unit delays running at four times the original sample frequency and allows processing of signals that are oversampled four times. The frequency response and group delay of the interpolator of FIG. 7 are illustrated in FIGS. 8A and 8B, respectively.

Figure 9:
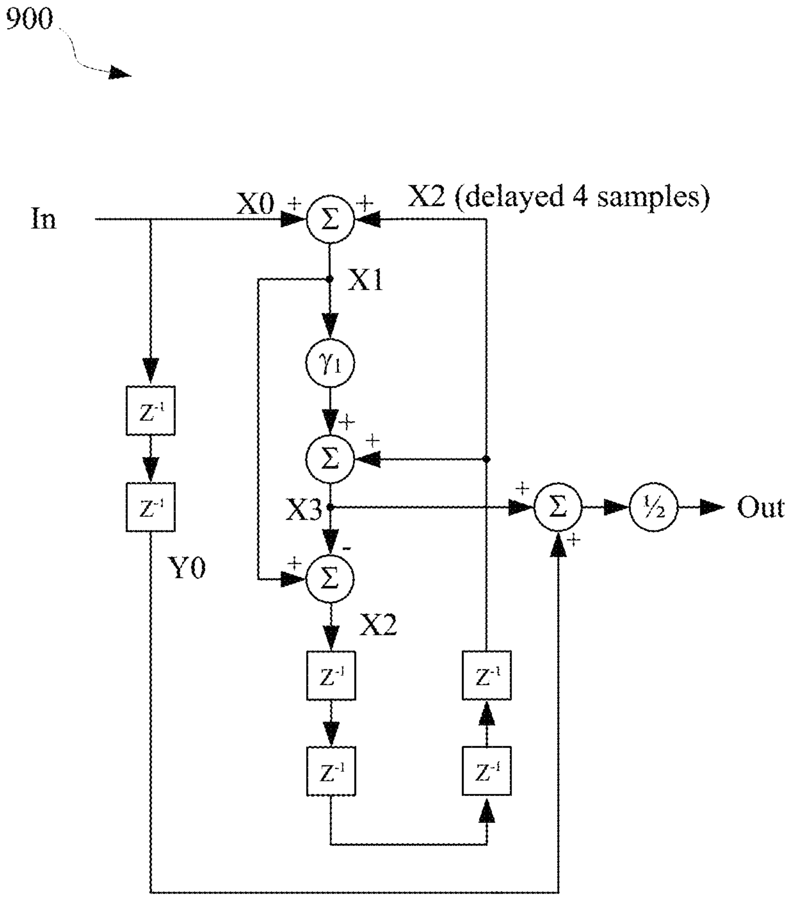
FIG. 9 illustrates a topology of a two times oversampled interpolation or decimation filter, in accordance with one or more embodiments.

Referring to FIG. 9, an embodiment of an oversampled interpolator topology 900 suitable for use as filter S7 of FIG. 4 is illustrated. As illustrated, the lattice wave interpolation filter is oversampled two times and the transfer function is calculated as follows (N=2):

$$Out=Y_0+X_3=X_0z^{-2}+X_3=X_0(\gamma+z^{-2}+z^{-4}+\gamma z^{-6})/(1+\gamma z^{-4}).$$

Figure 10A:
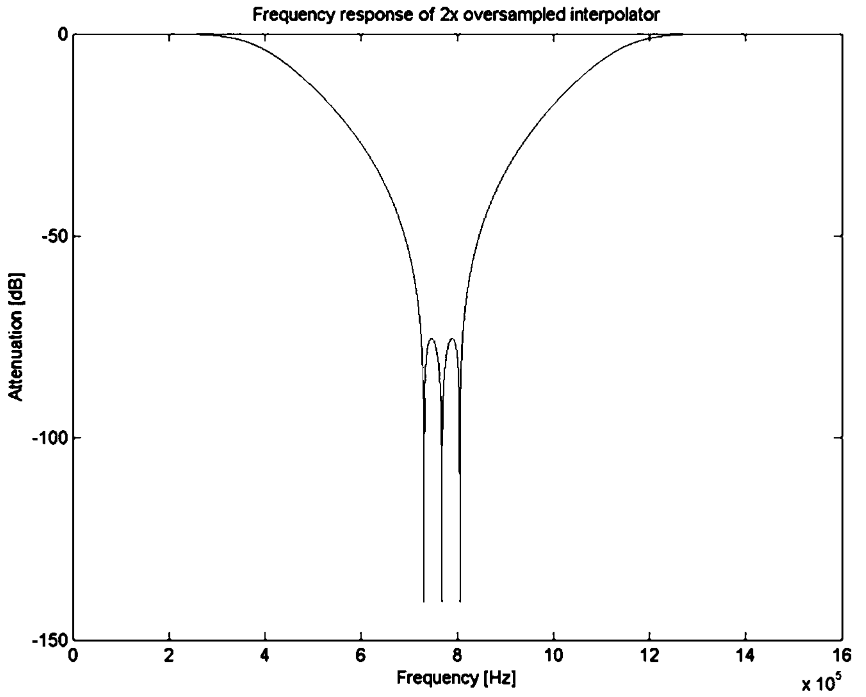
FIGS. 10A and 10B illustrate the frequency response and group delay of the oversampled filter of FIG. 9, in accordance with one or more embodiments, assuming a sample frequency of 3072 kHz.
Figure 10B:
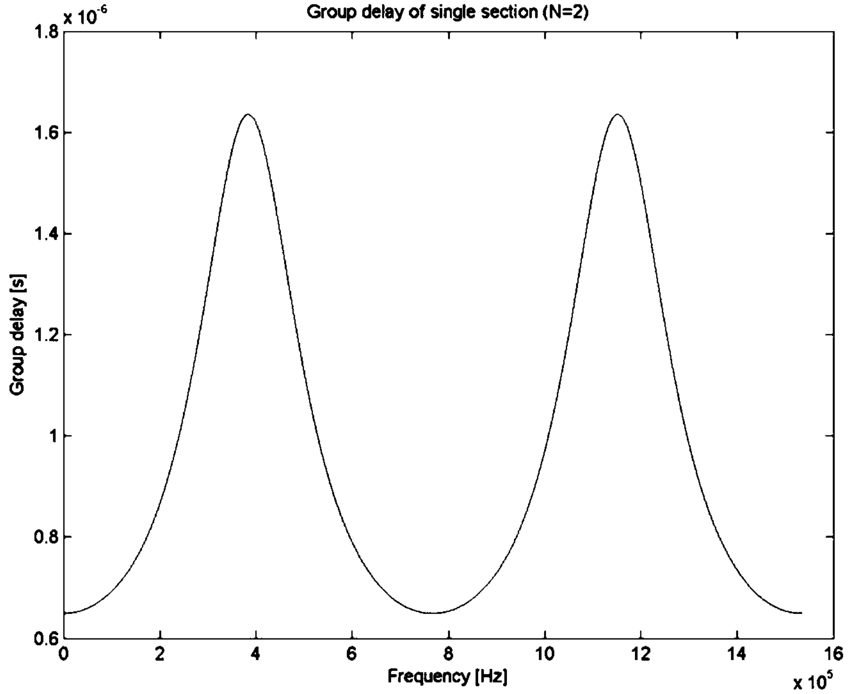

The frequency response and group delay of the two times oversampled interpolator of FIG. 9 are illustrated in FIGS. 10A and 10B, respectively.

Figure 11:
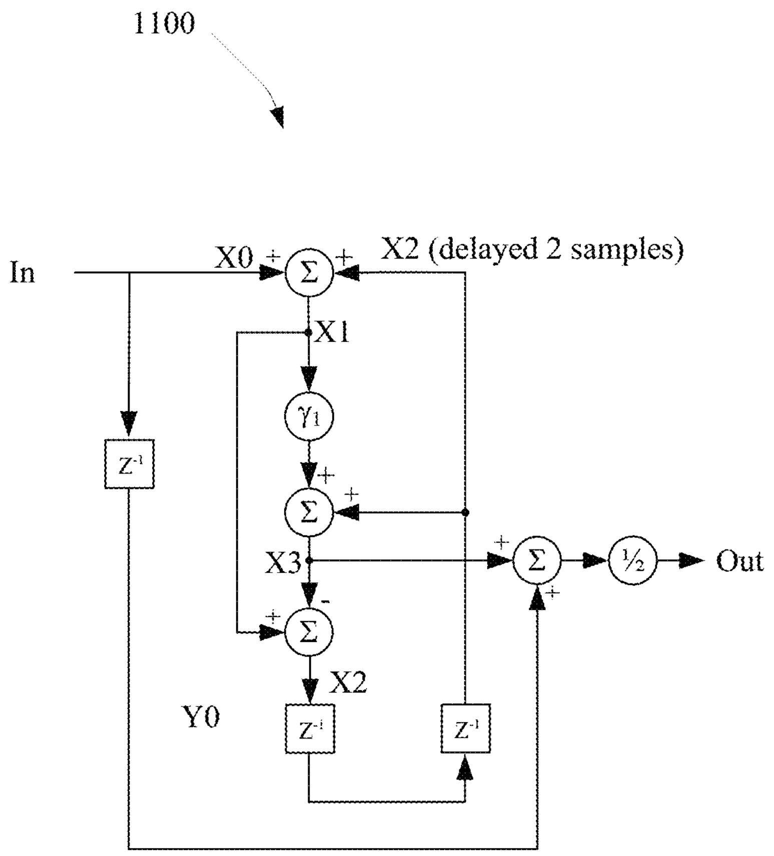
FIG. 11 illustrates a topology of an oversampled filter, in accordance with one or more embodiments.

Referring to FIG. 11, an embodiment of an oversampled interpolator topology 1100 suitable for use in section S8 of FIG. 4 is illustrated. As illustrated, the final lattice wave interpolation filter is a direct filter (i.e., no oversampling) and the transfer function is calculated as (N=1):

$$Out=Y_0+X_3=X_0z^{-1}+X_3=X_0(\gamma+z^{-1}+z^{-2}+\gamma z^{-3})/(1+\gamma z^{-2}).$$

Figure 12A:
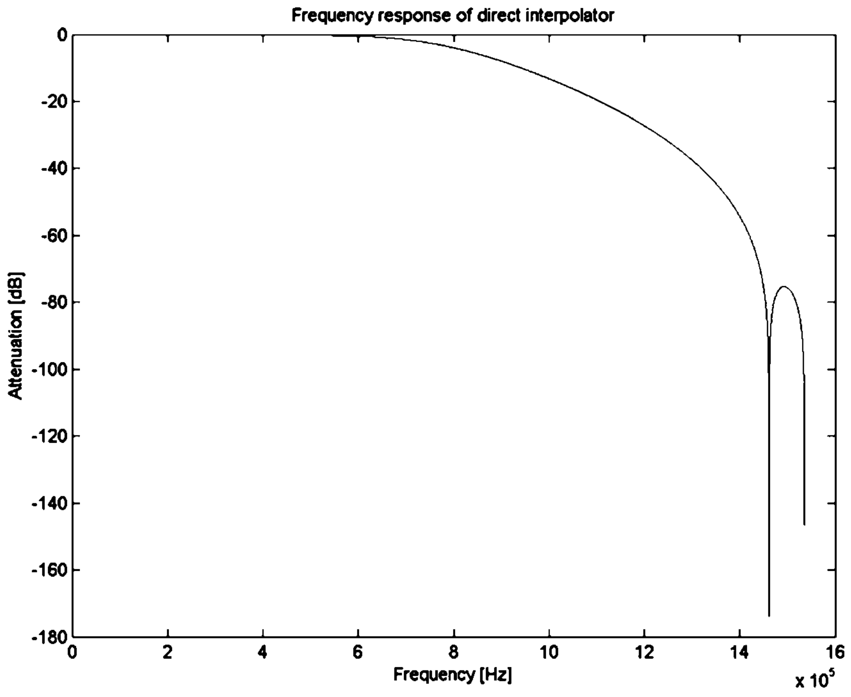
FIGS. 12A and 12B illustrate the frequency response and group delay of the oversampled interpolator of FIG. 11, in accordance with one or more embodiments, assuming a sample frequency of 3072 kHz.
Figure 12B:
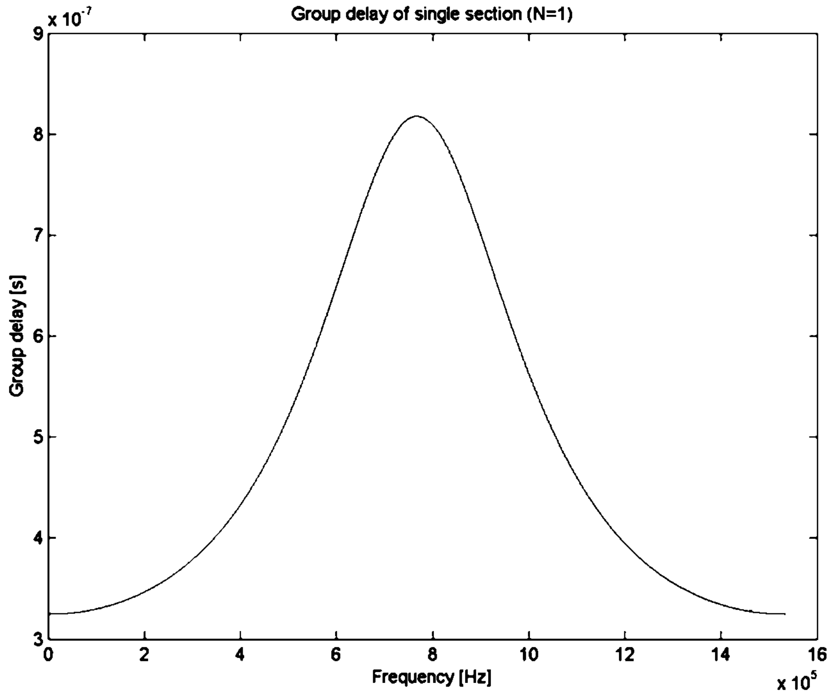

The frequency response and group delay of the direct interpolator of FIG. 11 are illustrated in FIGS. 12A and 12B, respectively.

Figure 13A:
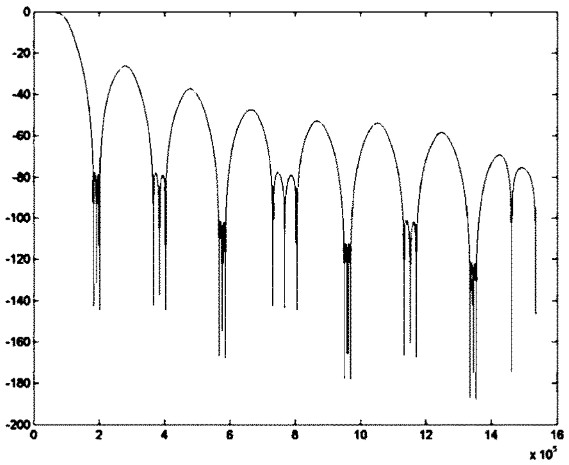
FIGS. 13A, 13B, and 13C illustrate a combined frequency response of the filter chain of FIG. 4, in accordance with one or more embodiments, assuming a sample frequency of 3072 kHz.
Figure 13B:
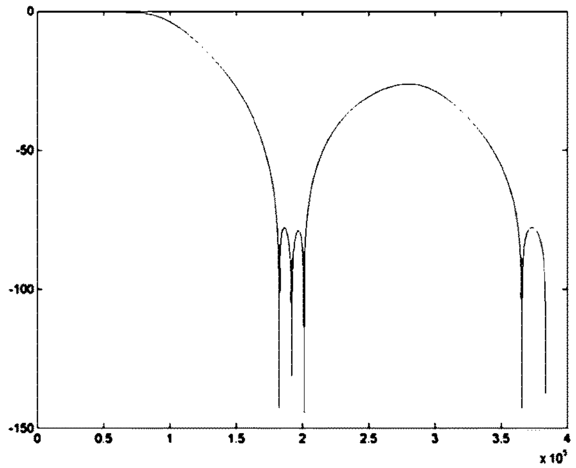
Figure 13C:
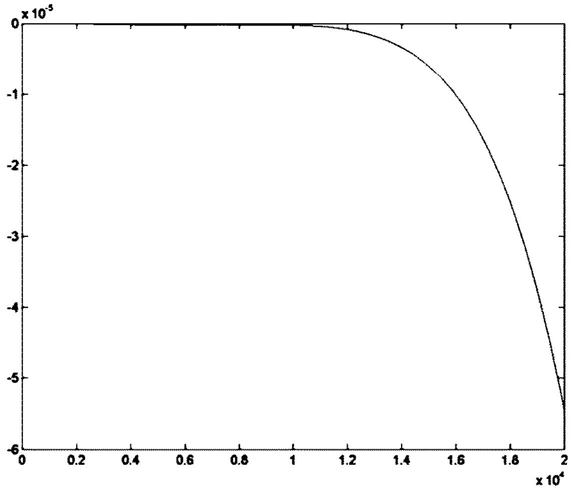
Figure 13D:
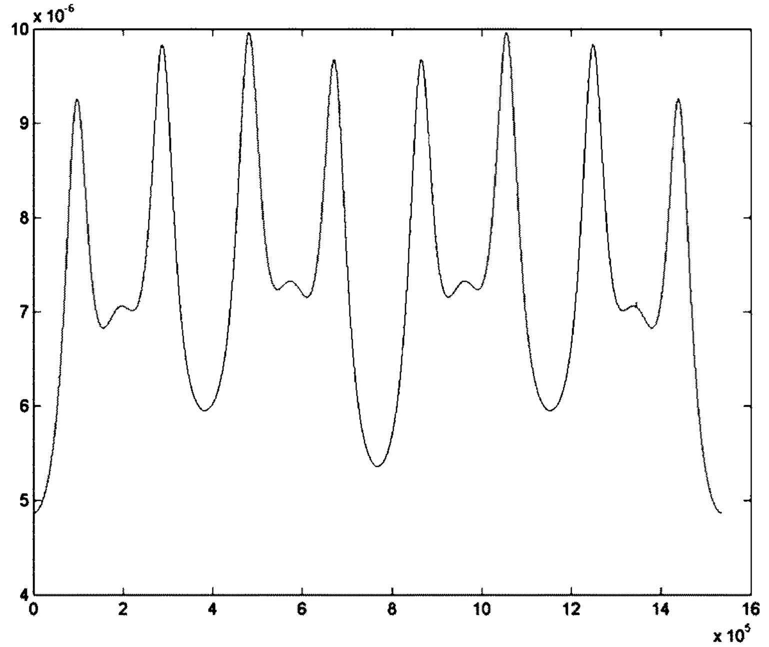
FIGS. 13D and 13E illustrate an overall group delay of the filter chain of FIG. 4, in accordance with one or more embodiments, assuming a sample frequency of 3072 kHz.
Figure 13E:
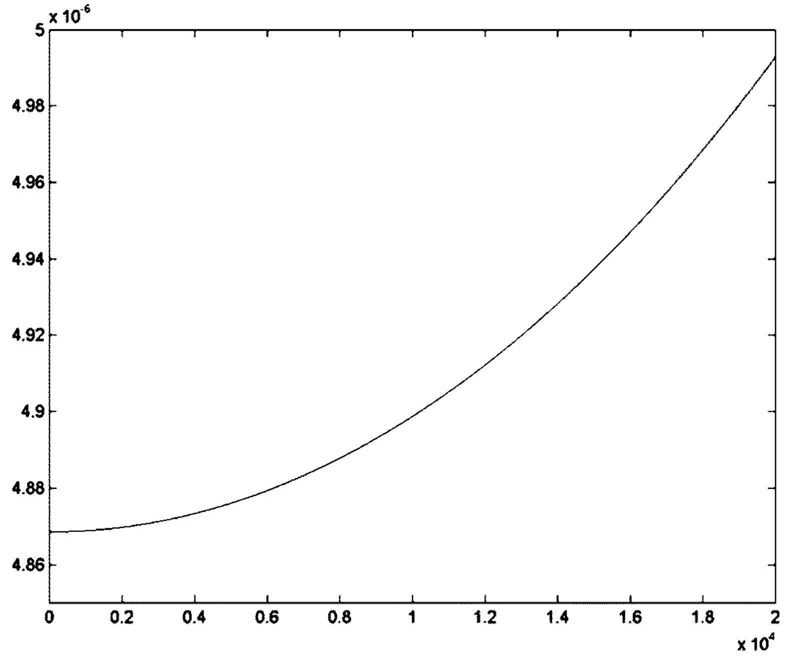

The combined response of the entire filter chain (i.e. sections S5-S8 of FIG. 4) is illustrated in FIGS. 13A-E. FIGS. 13A-C illustrate the overall frequency response at various audio bands. FIGS. 13D-E illustrate the overall group delay through the entire filter chain, assuming a sample frequency of 3072 kHz. Referring to FIG. 13E, it can be seen, that the group delay variation within the audio band 0-20 kHz may vary between 4.87 to 4.99 μs (14.95 to 15.34 input samples), or less than 3%, in an embodiment.

Figure 14:
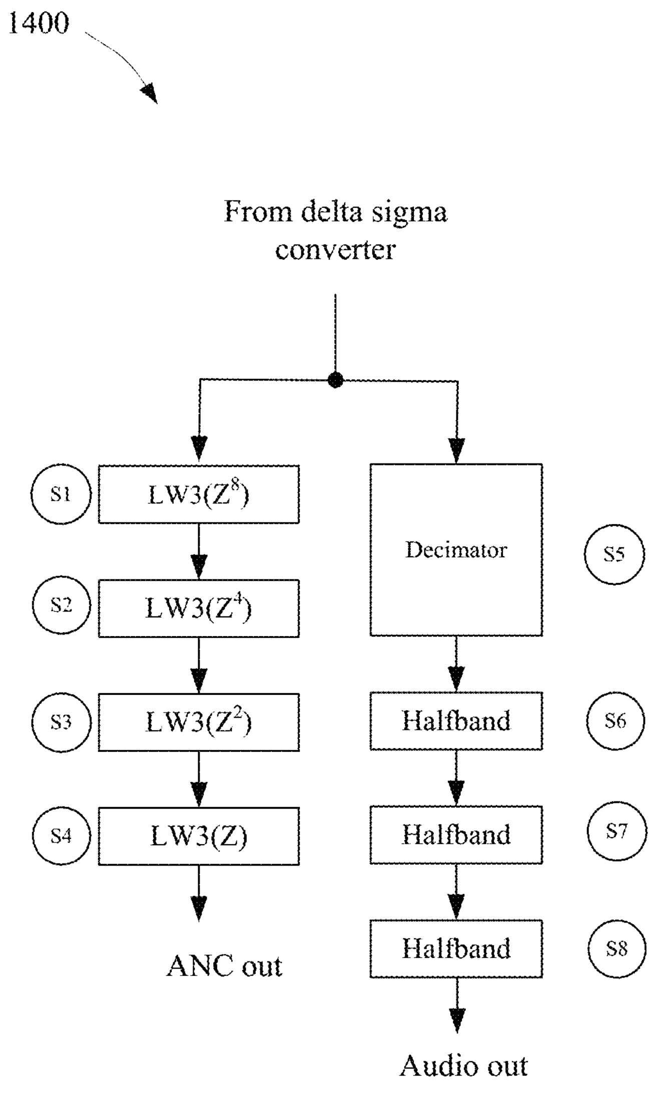
FIG. 14 illustrates a decimator, in accordance with one or more embodiments.

Referring to FIG. 14, an example filter arrangement 1400 for use as a decimator will now be described. In this embodiment, the low latency oversampled interpolation filter of the present disclosure is used as an oversampled decimator filter. One difference from the interpolation filter is that the output is decimated by a factor of 16. The figure shows an example configuration, where the signals take different paths to ensure the combination of low latency and high-quality audio is maintained. In various embodiments, it is possible to implement a decimation filter with almost the same latency but lower gate count by implementing all sections with N=1 and using multi-stage multi-rate signal processing, where each stage reduces the sample rate by a factor of two (i.e. running the sections at 3072, 1536, 768 and 384 kHz) or running an oversampled decimator at a lower frequency, e.g. 1536 or 768 kHz, because most of the delay occur in the sections with a high number of internal delays. Similarly, if allowing to compromise the high-quality audio very slightly, it is possible to perform the summation of audio and ANC signal at a lower frequency than the final output, e.g. at 1536 kHz with a final output of 3072 kHz and thereby obtain significantly lower gate count and lower power consumption. Furthermore, it is possible to design a multi-stage, multi-rate interpolator where each stage upsamples a signal by a factor of two using the same (N=1) low delay lattice wave filter. This has the advantage of lower gate count, but a slightly higher delay, due to slight delays between the sections in a practical implementation.

Figure 15:
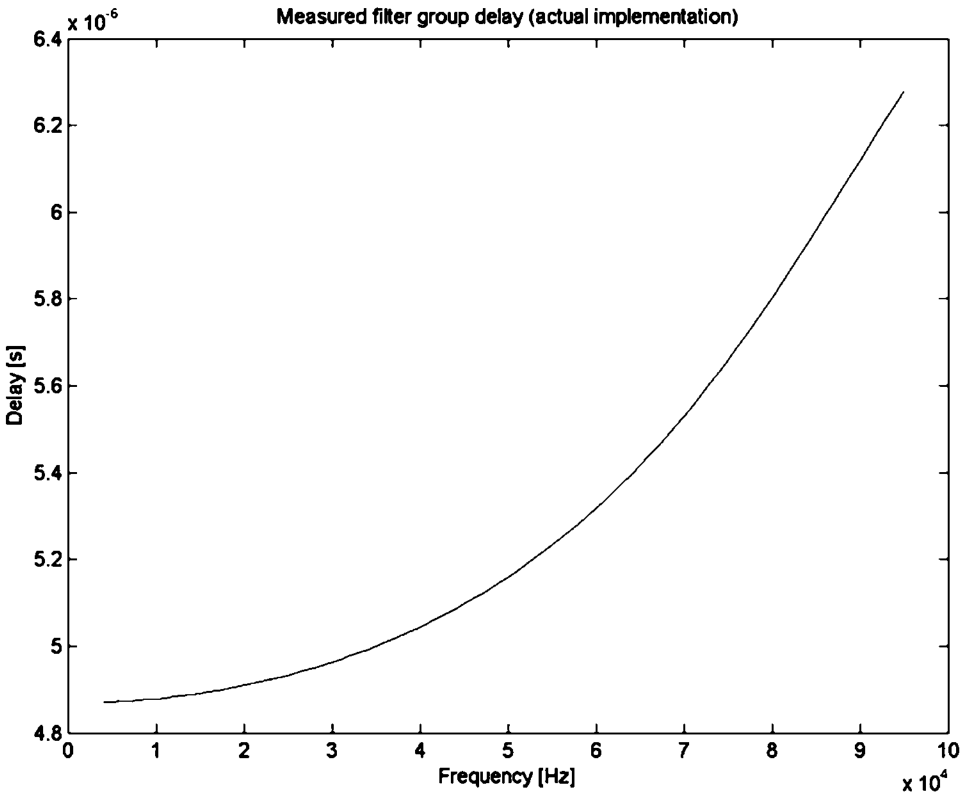
FIG. 15 illustrates a measurement of filter group delay, in accordance with one or more embodiments, assuming a sample frequency of 3072 kHz.

Referring to FIG. 15, a measurement of group delay will now be described in accordance with an embodiment of the present disclosure. The group delay can be measured using a single sine wave (e.g. a 1 kHz tone) or using multiple sine waves (e.g., in the range 1-95 kHz). To analyze the group delay of a single sine wave, a simple plot may be made of the input and output of an oversampled sine wave (1 kHz, sampling frequency 3072 kHz). A computer program can be prepared to compare the input sine wave with the output, such as by manual comparison using a zoom function to zoom in on the graph. Alternatively, the group delay can be calculated accurately using a program that uses a band of frequencies (e.g. 1-95 kHz, each tone spaced 1 kHz apart) and calculates the group delay using spectral methods (e.g., estimation of the phase of the input and output data). The original input is compared against the output and the group delay may be provided as a function of frequency. The phase as a function of frequency can be obtained by performing a fast Fourier transform (FFT) on the input and output data and subtracting these values. To avoid problems with phase aliasing, the phase $\phi$ may be unwrapped before used for calculation of the group delay. The group delay $\Delta T$ can be calculated from $\Delta T=\phi/(2\pi f)$, where f is the frequency.

Figure 16A:
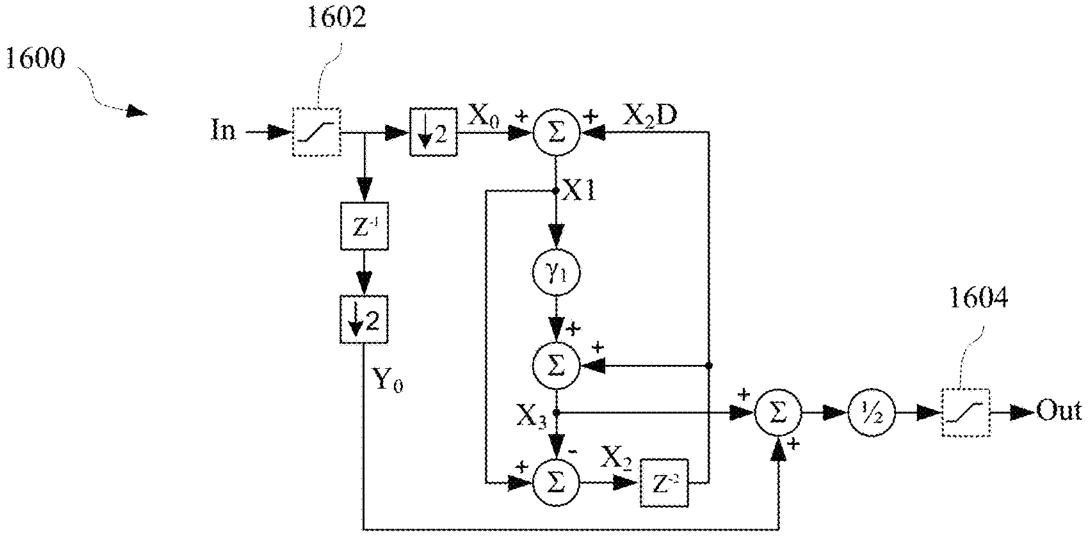
FIGS. 16A, 16B, and 16C illustrate a decimator and logic for performing sign extension and saturation of output, in accordance with one or more embodiments.
Figure 16B:
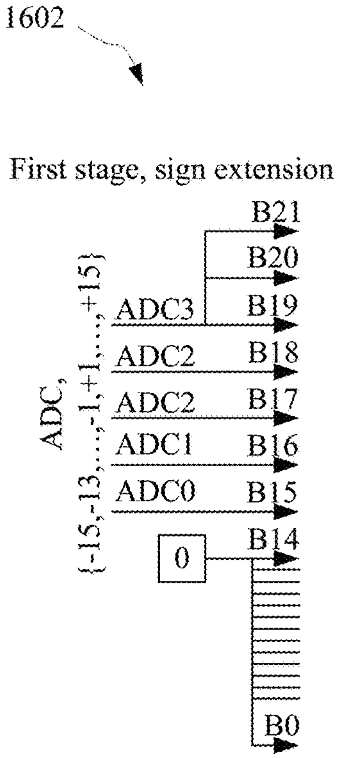
Figure 16C:
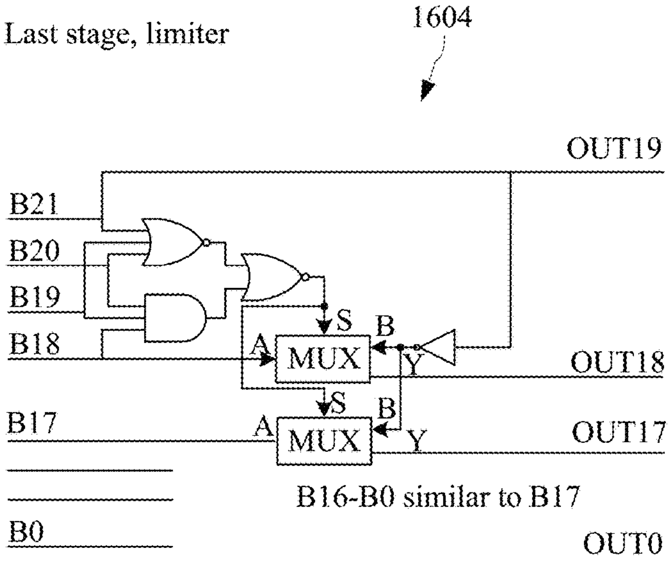

Referring to FIGS. 16A-C, an embodiment of a decimator will now be described. FIG. 16A illustrates a decimator 1600 arranged to receive a digital audio input from an analog to digital converter and output an audio signal at a reduced sampling rate by a factor of two. The illustrated embodiment shows additional components included when performing decimation to avoid problems with internal overflow during processing. A first stage 1602 is illustrated in FIG. 16B and includes a sign extension to 22 bits, i.e. extending the most significant bit (MSB) to avoid overflow and setting the lowest bits to zero to act as an interface between the limited number of bits from the converter and the internal precision used in the filter. The decimator 1600 is arranged similar to the interpolator of FIG. 11 except the two processing paths ($Y_0$ and $X_0$) may be calculated at half the input sample rate to reduce power consumption. The double delay $Z^{-2}$ following node X2 may even be implemented using a single delay element updated at half the input sample rate to save register space and power. In the illustrated embodiment, all nodes of the decimator 1600 are 22 bits, including 2 overflow bits and 20 fractional bits. In one embodiment, the value of $\gamma_1=1/4+1/16+1/64+1/128$, and is used for a multiplication free topology. The last stage includes a limiter 1604 (illustrated in FIG. 16C) which provides hard clipping and generates a 20 bits output. The limiter works by checking if the three highest bits are equal. If this is the case, the original lower bits are copied directly to the output. However, if the three upper bits are not all the same, an overflow condition has been detected and all lower bits will be the inverted value of the MSB, to signify the most extreme value that is possible with a two's complement notation. Other values of the number of overflow bits can be chosen.

Figure 17A:
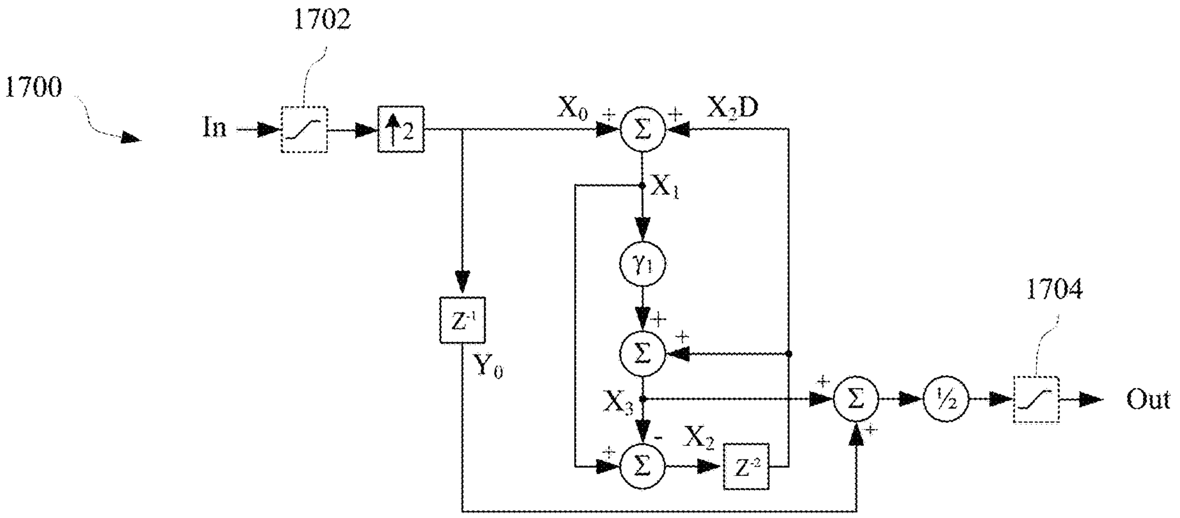
FIGS. 17A, 17B, and 17C illustrate an interpolator and logic for performing sign extension and saturation of output, in accordance with one or more embodiments.
Figure 17B:
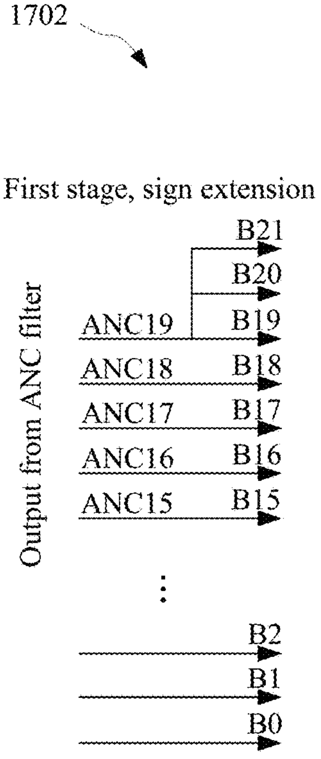
Figure 17C:
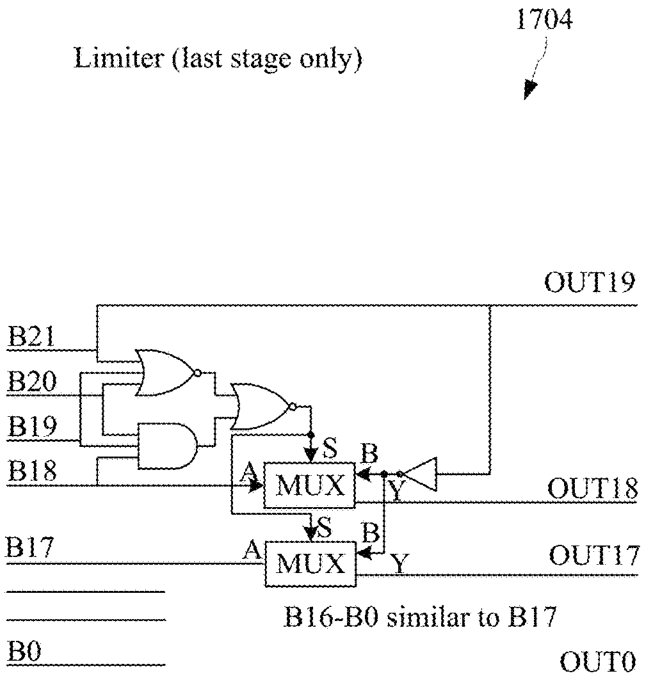

Referring to FIGS. 17A-C, an embodiment of an interpolator will now be described. FIG. 17A illustrates an interpolator 1700 arranged to receive a digital audio input from an adaptive noise cancellation processor to output an audio signal having a higher sampling rate by a factor of two. The illustrated embodiment shows additional components included when performing interpolation to avoid problems with overflow during processing. A first stage 1702 (also referred to herein as a sign extension stage) is illustrated in FIG. 17B and includes a sign extension to 22 bits (i.e. extending the MSB and setting the lowest bits to zero). In the illustrated embodiment, all nodes of the interpolator 1700 are 22 bits, including 2 overflow bits and 20 fractional bits. In one embodiment, the value of $\gamma_1 = 1/4 + 1/16 + 1/64 + 1/128$, and is used in a multiplication free implementation. The last stage includes a limiter 1704 (illustrated in FIG. 17C and similar to FIG. 16C) which provides hard clipping and generates a 20 bits output.

Figure 18:
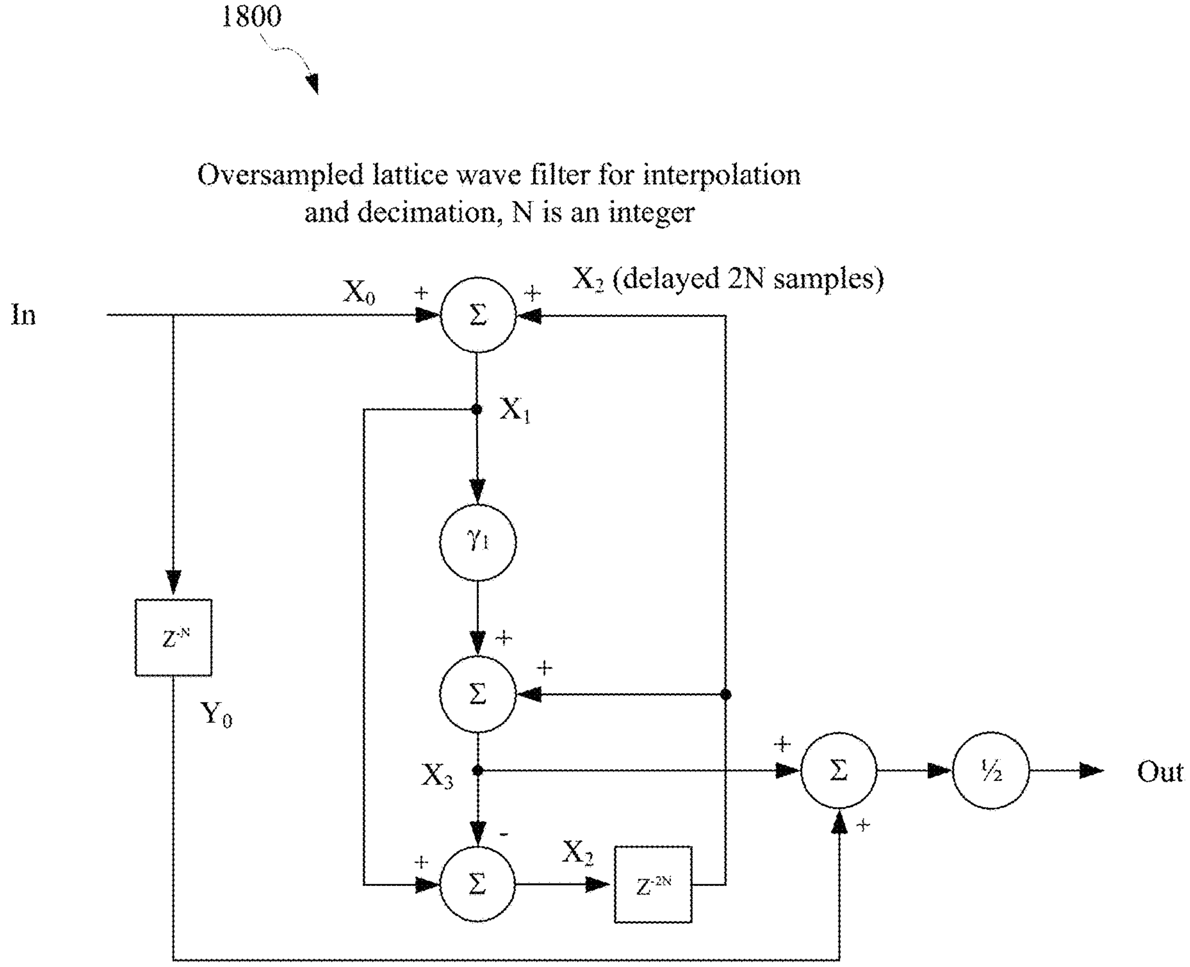
FIG. 18 illustrates a generalized oversampled filter topology, in accordance with one or more embodiments.

Referring to FIG. 18, a generalized oversampled lattice wave filter topology 1800 is illustrated, in accordance with one or more embodiments. As illustrated, the generalized filter topology 1800 shows a structure (two-port adaptor) with multiple delay elements inside (delay N, 2N). In operation, the oversampled filter includes ×N delay elements (e.g. 2×, 4×, 8×, 16×, etc.), and the filter is run at a higher frequency than required by the Nyquist sampling criterion. The input stream is perceived as many streams coming through at a lower frequency and the signal "bubbles" through these delays. For example, to process the signals at twice the original anticipated sample rate the filter may include twice the delays and run at twice the rate. As a recursive system, the signal rotates around the system allowing the filter to process an oversampled signal because of the extra delays. In various embodiments, the concepts disclosed herein may be extended to include delays (M, N) and (N, 2N) might be used, where M and N are arbitrary positive integers. In other words, this works like a polyphase IIR filter.

Figure 19A:
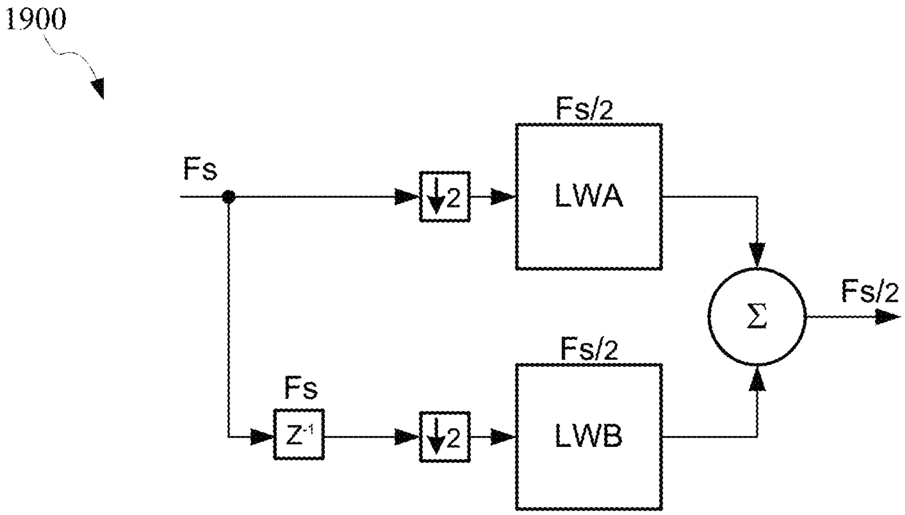
FIGS. 19A-B illustrate decimation and interpolation using lattice wave filter structures, in accordance with one or more embodiments.
Figure 19B:
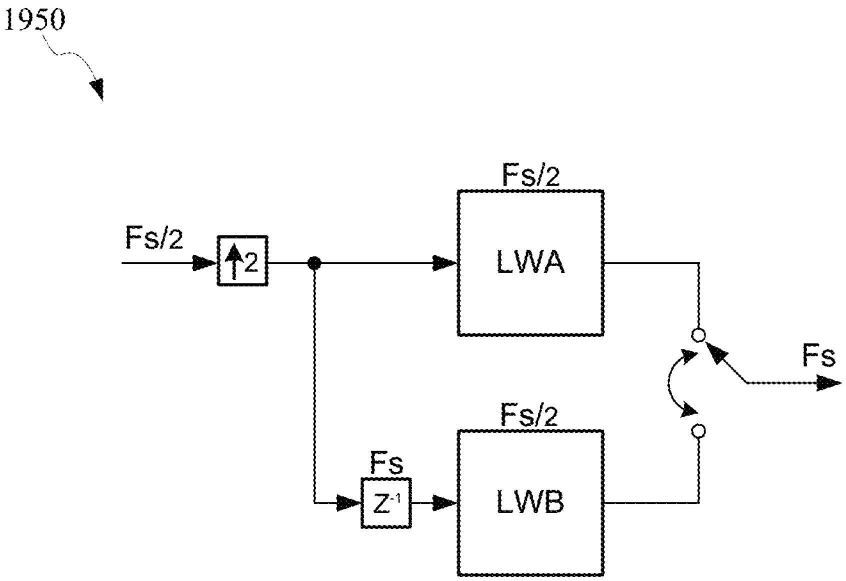
Figure 20A:
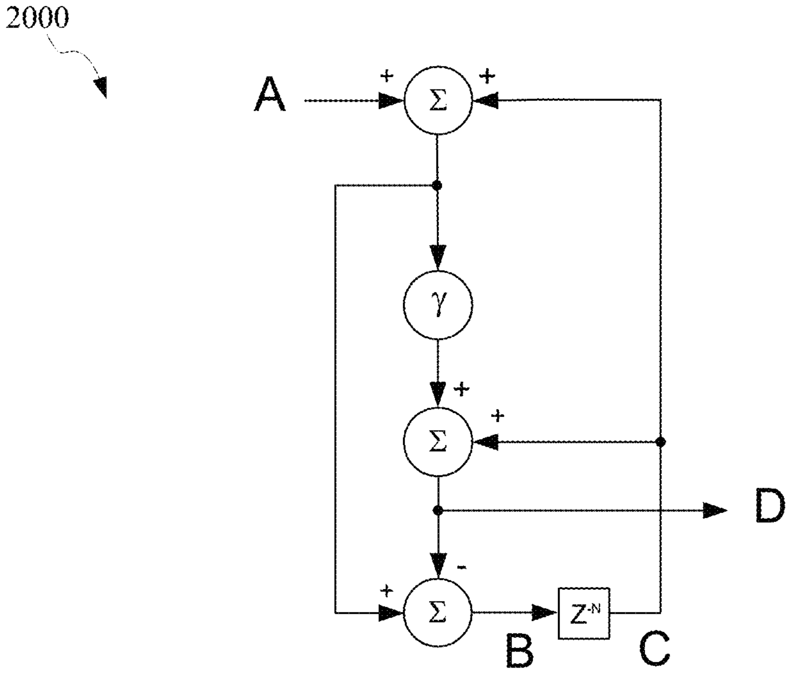
FIGS. 20A-B illustrate a single section of a lattice wave filter and an example implementation, in accordance with one or more embodiments.
Figure 20B:
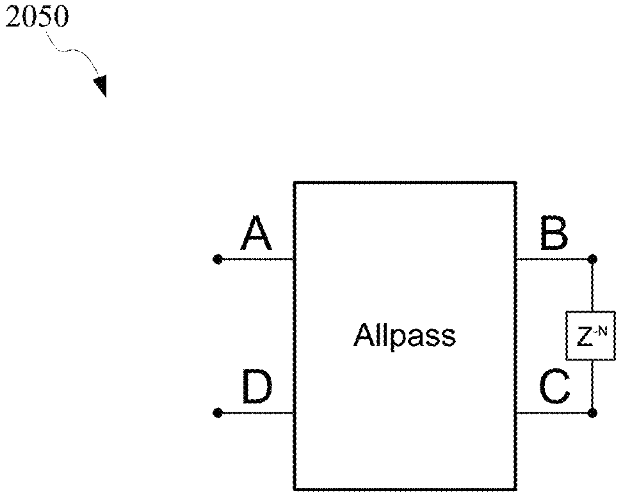
Figure 21:
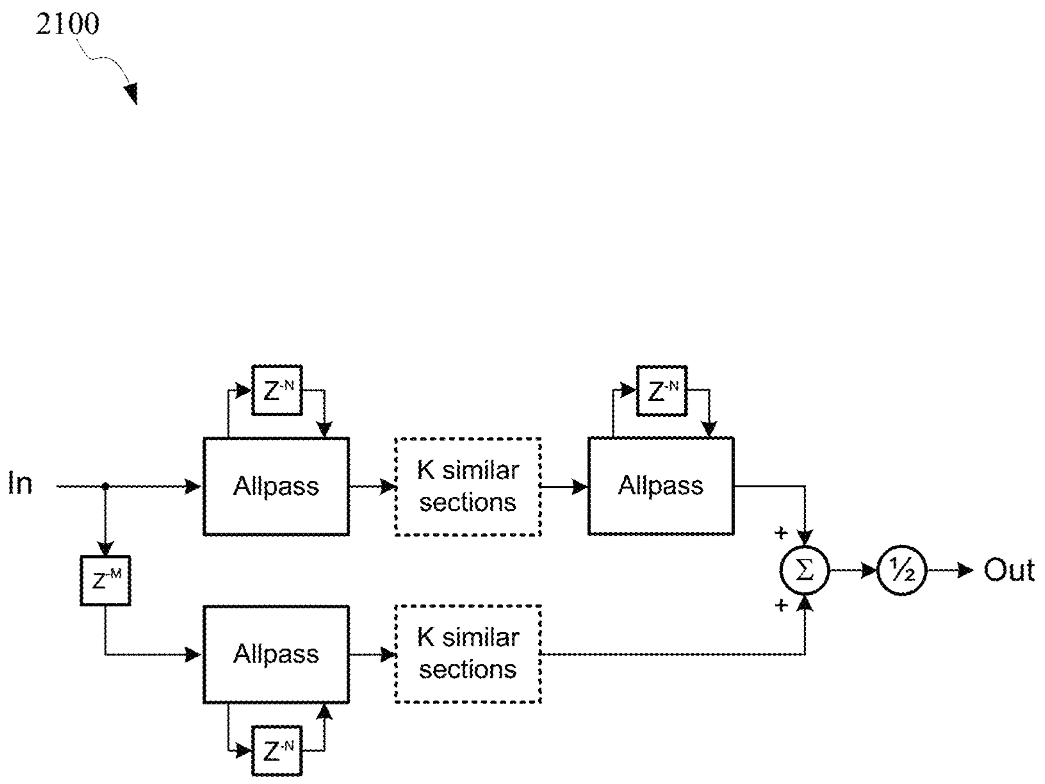
FIG. 21 illustrates an oversampled decimator/interpolator having multiple delay elements and multiple allpass filters, in accordance with one or more embodiments.
Figure 22:
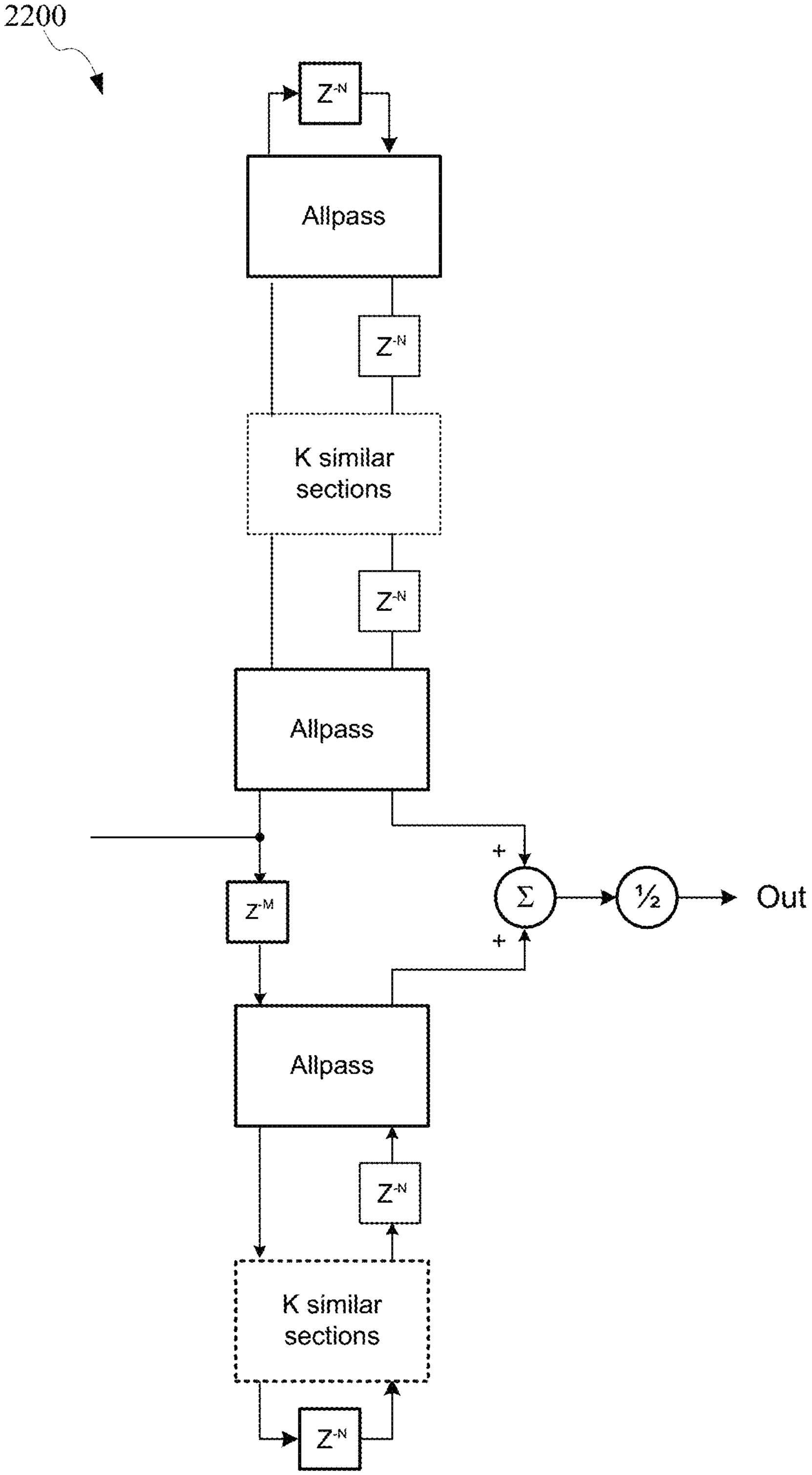
FIG. 22 illustrates an oversampled decimator/interpolator having multiple delay elements and multiple allpass filters, in accordance with one or more embodiments.

Various implementation embodiments will now be described with referenced to FIGS. 19-22. FIG. 19A illustrates a decimator 1900 using a lattice wave filter structure. FIG. 19B illustrates an interpolator 1950 using a lattice wave filter structure. As illustrated in FIGS. 19A & B, each path represents one or more cascaded allpass filters (based on two-port adaptors) that pass through all frequencies. In various embodiments, the allpass filter is a filter with a unity response that changes the signal only in phase. FIG. 20A illustrates a single section (a single two-port adaptor) 2000 of a lattice wave filter, and FIG. 20B illustrates an example implementation of a two-port adapter 2050. FIGS. 21 and 22 illustrate embodiments in which the number of delay elements may be an arbitrary number (e.g., N>2). FIG. 21 illustrates a general lattice wave filter structure 2100 for an oversampled decimator/interpolator having multiple delay elements and multiple allpass filters. As illustrated the order of the filter is) N(2K+3)+M. By choosing more delay elements than two, multiple mirror images of the original transfer function may be obtained, even though these are recursive filters. This may be used for efficient and fast filter structures. FIG. 22 illustrates a general lattice wave filter structure 2200 for an oversampled decimator/interpolator having multiple filters that process outputs from other filters. By using more than one or two delay elements, multiple mirror images may be obtained that may be beneficial for direct decimation or interpolation of factors higher than a value of two. In some embodiments, high pass filters may be obtained using similar approaches by subtracting instead of adding the two filter paths at the final output node.

In the previous embodiments, a particular structure of an oversampled lattice wave filter has been presented. It is well known within the open literature that many topologies of the original lattice waveform filter exist (see, e.g., L. Gasci, "Explicit Formulas for Lattice Wave Digital Filters", IEEE Trans. Circuits and Systems, January 1985, FIG. 9, for multiple examples of two-port adaptors). The embodiments should not be limited to the topology described here but also include all that have previously been described, e.g., including the multiple delay elements in these existing structures with an oversampling factor higher than two or the use multiple delay element, where the number is higher than two in general applications.

Where applicable, various embodiments provided by the present disclosure may be implemented using hardware, software, or combinations of hardware and software. Also, where applicable, the various hardware components and/or logic components set forth herein may be combined into composite components comprising software, hardware, and/or both without departing from the scope of the present disclosure. Where applicable, the various hardware components and/or logic components set forth herein may be separated into sub-components comprising software, hardware, or both without departing from the scope of the present disclosure. In addition, where applicable, it is contemplated that software components may be implemented as hardware components and vice versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. For example, although the low delay decimators and low delay interpolators disclosed herein are described with reference to adaptive noise cancellation systems, it will be appreciated that the low delay filters disclosed herein may be used in other signal processing systems. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A system comprising:

an audio sensor configured to sense environmental noise and generate a noise signal;

an audio processing path configured to receive an audio signal, process the audio signal through an interpolation filter, and generate a primary audio signal having a first sample frequency;

an adaptive noise cancellation processor configured to receive the noise signal and generate a corresponding anti-noise signal;

a direct interpolator configured to receive the anti-noise signal and generate an upsampled anti-noise signal having the first sample frequency without filtering aliased images;

an adder configured to receive and combine the primary audio signal and the upsampled anti-noise signal and generate a combined output signal; and a low latency filter configured to process the combined output signal to filter out the aliased images.

2. The system of claim 1, wherein the low latency filter comprises a plurality of filters, each performing filtering at a different sample frequency.

3. The system of claim 2, wherein the low latency filter comprises a plurality of lattice wave filters disposed in a cascaded arrangement, wherein each of the plurality of lattice wave filters processes a different frequency band.

4. The system of claim 3, wherein the sample frequency is increased in integer steps in each successive filter.

5. The system of claim 3, wherein the lattice wave filters include a plurality of delay elements; and wherein direct sampling at a particular output sample frequency is achieved by interlacing multiple filters.

6. The system of claim 5, wherein N delay elements are provided in reflector sections and one path is delayed by N/2 delay elements, and another path is directly connected to an input signal; and wherein N is a sequence of positive integer exponents of 2.

7. The system of claim 3, wherein each lattice wave filter comprises two paths, including one path including a plurality of reflector elements with each reflector element delayed by N unit delays, where N is an integer greater than one, and one path delayed by M delay elements, where M is an integer greater than one.

8. The system of claim 1, wherein the adaptive noise cancellation processor is further operable to derive the anti-noise signal by calculating filter coefficients using by a filtered-X least mean squares process.

9. The system of claim 1 wherein the direct interpolator comprises a sign extension stage operable to extend most significant bits of the anti-noise signal to avoid overflow, and a limiter operable to provide clipping to reduce a number of bits in the upsampled anti-noise signal.

10. A system comprising an audio processing path configured to receive and process an oversampled primary audio signal having a first sample frequency;

an adaptive noise cancellation path comprising a decimator configured to downsample the primary audio signal to a second sampling frequency, an adaptive noise cancellation processor configured to receive the primary audio signal and a noise signal at the second sample frequency and generate an anti-noise signal having the second sample frequency, and an interpolator configured to upsample the anti-noise signal to the first sample frequency without filtering aliased images;

an adder configured to combine the anti-noise signal and the primary audio signal at the first sample frequency; and a low latency filter configured to process the combined anti-noise signal and the primary audio signal to filter out the aliased images;

wherein the decimator comprises a first lattice wave filter, and the interpolator comprises a second lattice wave filter having two paths with N delay elements and M delay elements, respectively.

11. The system of claim 10 wherein the first lattice wave filter comprises a first path including a plurality of reflector elements with each reflector element delayed by N delay elements, where N is an integer greater than two; and a second path delayed by M delay elements, where M is an integer greater than one.

12. The system of claim 10, further comprising a microphone operable to sense environmental noise and generate corresponding electrical signals; and a low delay decimator to generate the noise signal at the second sample frequency.

13. The system of claim 10, further comprising an oversampled interpolation filter that has input and output sample frequencies that match the first sample frequency; and wherein the oversampled interpolation filter is operable to remove aliased images generated by the interpolator in the adaptive noise cancellation path.

14. The system of claim 10, wherein the first lattice wave filter and the second lattice wave filter each comprise a multi-stage lattice wave filter structure where each stage changes an operating sample rate by a factor of two.

15. The system of claim 14, wherein the decimator and interpolator each comprise a sign extension stage operable to extend most significant bits of a received signal to avoid overflow, and a limiter operable to provide clipping to reduce a number of output bits.

16. A method comprising

Sensing environmental noise and generating a noise signal;

Processing an audio signal through an interpolation filter to generate a primary audio signal having a first sample frequency;

generating, from the noise signal, an anti-noise signal having a second sample frequency; directly interpolating the anti-noise signal to generate an upsampled anti-noise signal having the first sample frequency without filtering aliased images; combining the primary audio signal and the upsampled anti-noise signal to produce a combined output signal; and processing the combined output signal through a low latency filter to filter the aliased images.

17. The method of claim 16, wherein filtering comprises applying a plurality of lattice wave filters disposed in a cascaded arrangement, wherein each of the plurality of lattice wave filters processes a different sample frequency that is successively changed in each successive filter.

18. The method of claim 16, wherein directly interpolating includes extending most significant bits of the anti-noise signal to avoid overflow, and clipping to reduce a number of output bits in the upsampled anti-noise signal.

19. The method of claim 16, further comprising decimating the primary audio signal to downsample the primary audio signal to the second sample frequency; and wherein the generating, from the noise signal, the anti-noise signal having the second sample frequency further includes analyzing the downsampled primary audio signal.

20. The method of claim 16, wherein generating, from the noise signal, the anti-noise signal having the second sample frequency comprises calculating filter coefficient using a filtered-X least mean squares process.

* * * * *